United States Patent
Nomura

(10) Patent No.: US 9,673,018 B2
(45) Date of Patent: Jun. 6, 2017

(54) CHARGED PARTICLE BEAM WRITING APPARATUS AND CHARGED PARTICLE BEAM WRITING METHOD

(71) Applicant: NuFlare Technology, Inc., Yokohama-shi (JP)

(72) Inventor: Haruyuki Nomura, Yokohama (JP)

(73) Assignee: NuFlare Technology, Inc., Yokohama-shi (JP)

(*) Notice: Subject to any disclaimer, the term of this patent is extended or adjusted under 35 U.S.C. 154(b) by 0 days.

(21) Appl. No.: 15/145,398

(22) Filed: May 3, 2016

(65) Prior Publication Data
US 2016/0336141 A1   Nov. 17, 2016

(30) Foreign Application Priority Data
May 13, 2015  (JP) .................... 2015-097891

(51) Int. Cl.
  *H01J 37/10*   (2006.01)
  *H01J 37/14*   (2006.01)
  *H01J 37/317*  (2006.01)
  *H01J 37/063*  (2006.01)
  *H01J 37/09*   (2006.01)

(52) U.S. Cl.
  CPC ............ *H01J 37/14* (2013.01); *H01J 37/063* (2013.01); *H01J 37/09* (2013.01); *H01J 37/3174* (2013.01); *H01J 2237/043* (2013.01); *H01J 2237/0451* (2013.01); *H01J 2237/0458* (2013.01); *H01J 2237/0653* (2013.01)

(58) Field of Classification Search
  USPC .................. 250/492.1, 492.2, 492.22, 492.3
  See application file for complete search history.

(56) References Cited

FOREIGN PATENT DOCUMENTS

| JP | 2002-353128 | 12/2002 |
|---|---|---|
| JP | 2007-208035 | 8/2007 |

*Primary Examiner* — Nicole Ippolito
*Assistant Examiner* — Hanway Chang
(74) *Attorney, Agent, or Firm* — Oblon, McClelland, Maier & Neustadt, L.L.P.

(57) ABSTRACT

A charged particle beam writing apparatus includes a limiting aperture member at the downstream side of the emission source, arranged such that its height position can be selectively adjusted, according to condition, to be one of the n-th height position (n being an integer of 1 or more) based on the n-th condition depending on at least one of the height position of the emission source and an emission current value, and the (n+m)th height position (m being an integer of 1 or more) based on the (n+m)th condition depending on at least one of the height position of the emission source and the emission current value, and a shaping aperture member at the downstream side of the electron lens and the limiting aperture member to shape the charged particle beam by letting a part of the charged particle beam pass through a second opening.

10 Claims, 17 Drawing Sheets

CHARGED PARTICLE BEAM WRITING APPARATUS AND CHARGED PARTICLE BEAM WRITING METHOD

CROSS-REFERENCE TO RELATED APPLICATION

This application is based upon and claims the benefit of priority from the prior Japanese Patent Application No. 2015-097891 filed on May 13, 2015 in Japan, the entire contents of which are incorporated herein by reference.

BACKGROUND OF THE INVENTION

Field of the Invention

Embodiments of the present invention relate generally to a charged particle beam writing apparatus and a charged particle beam writing method, and more specifically, for example, relate to a method for correcting chromatic aberration of an electron beam used in an electron beam writing apparatus that irradiates electron beams on a target object.

Description of Related Art

In recent years, with high integration of LSI, the line width (critical dimension) of circuits of semiconductor devices is becoming progressively narrower. As a method for forming an exposure mask (also called a reticle) used to form circuit patterns on these semiconductor devices, the electron beam (EB) writing technique having excellent resolution is employed.

FIG. 19 is a conceptual diagram explaining operations of a variable-shaped electron beam writing or "drawing" apparatus. The variable-shaped electron beam writing apparatus operates as described below. A first aperture plate 410 has a quadrangular aperture 411 for shaping an electron beam 330. A second aperture plate 420 has a variable shape aperture 421 for shaping the electron beam 330 having passed through the aperture 411 of the first aperture plate 410 into a desired quadrangular shape. The electron beam 330, which was emitted from a charged particle source 430 and has passed through the aperture 411, is deflected by a deflector to pass through a part of the variable shape aperture 421 of the second aperture plate 420, and thereby to irradiate a target object or "sample" 340 placed on a stage which continuously moves in one predetermined direction (e.g., x direction) during writing. In other words, a quadrangular shape that can pass through both the aperture 411 of the first aperture plate 410 and the variable shape aperture 421 of the second aperture plate 420 is used for pattern writing in a writing region of the target object 340 on the stage continuously moving in the x direction. This method of forming a given shape by letting beams pass through both the aperture 411 of the first aperture plate 410 and the variable shape aperture 421 of the second aperture plate 420 is referred to as a variable shaped beam (VSB) system.

In electron beam writing, importance is attached to throughput, in manufacturing masks. On the other hand, importance is attached to resolution of beams, in performing various evaluation to develop next-generation lithography, because finer pattern formation is requested therefor.

In terms of putting emphasis on throughput, when increasing luminance of the cathode of an electron gun, it is necessary to increase an emission current emitted from the cathode of the electron gun. Therefore, required is a writing apparatus which can deal with (respond to) both the high emission condition (high emission mode) attaching weight to throughput, and the low emission condition (low emission mode) attaching weight to resolution. However, if the emission current is increased, so-called chromatic aberration becomes worse due to energy dispersion increase by the longitudinal Boersch effect. Accordingly, there is a problem that the states of chromatic aberration in both the modes are different. This results in that the states of chromatic aberration of electron beams illuminating the shaping aperture arranged at the downstream side become different and shaped beams are affected by such chromatic aberration.

With respect to adjustment of an illumination optical system, there is disclosed a technique for flattening a current density of a beam at the shaping aperture which shapes beams at the downstream side, wherein the flattening is performed by moving a trim aperture up and down to adjust the positional relationship between the trim aperture and the crossover of the beam immediately beneath the trim aperture (for example, refer to Japanese Patent Application Laid-open (JP-A) No. 2007-208035).

BRIEF SUMMARY OF THE INVENTION

According to one aspect of the present invention, a charged particle beam writing apparatus includes an emission source configured to emit a charged particle beam; a limiting aperture member placed at a downstream side of the emission source with respect to an optical axis direction, in which a first opening is formed, and arranged such that its height position can be selectively adjusted, according to condition, to be one of an n-th height position (n being an integer greater than or equal to 1) based on an n-th condition depending on at least one of a height position of the emission source and an emission current value, and an (n+m)th height position (m being an integer greater than or equal to 1), being different from the n-th height position, based on an (n+m)th condition depending on at least one of the height position of the emission source and the emission current value; an electron lens arranged at the downstream side of the limiting aperture member with respect to the optical axis direction, and configured to refract the charged particle beam having passed through the first opening; and a shaping aperture member arranged at the downstream side of the electron lens with respect to the optical axis direction, in which a second opening is formed, and configured to be irradiated with the charged particle beam having been refracted by a region including a whole of the second opening, and to shape the charged particle beam by letting a part of the charged particle beam pass through the second opening, wherein a pattern is written on a target object by using at least a part of the charged particle beam having been shaped.

According to another aspect of the present invention, a charged particle beam writing method includes setting an n-th condition (n being an integer greater than or equal to 1) depending on at least one of a height position of an emission source for emitting a charged particle beam and an emission current value; adjusting, based on that the n-th condition has been set, a height position of a shaping aperture member, arranged at a downstream side of the emission source with respect to an optical axis direction and having a first opening penetrating from an upper surface to a lower surface, to an n-th height position; receiving irradiation of the charged particle beam on the shaping aperture member, based on the n-th condition, in a state where a limiting aperture member has been adjusted to the n-th height position, and shaping the charged particle beam by letting a part of the charged particle beam pass through a second opening of the shaping aperture member; performing an n-th writing processing by using at least a part of the charged particle beam having been shaped based on the n-th condition; resetting the n-th condition to an (n+m)th condition (m being an integer greater than or equal to 1), being different from the n-th condition, depending on at least one of the height position of the emission source and an emission current value; readjusting, based on that resetting has been performed to set to the (n+m)th condition, the height position of the shaping aperture member from the n-th height position having been adjusted to an (n+m)th height position; receiving irradiation of the charged particle beam on the shaping aperture member, based on the (n+m)th condition, in a state where the limiting aperture member has been readjusted to the (n+m)th height position, and shaping the charged particle beam by letting a part of the charged particle beam pass through the second opening of the shaping aperture member; and performing an (n+m)th writing processing by using at least a part of the charged particle beam having been shaped based on the (n+m)th condition.

DETAILED DESCRIPTION OF THE INVENTION

In the embodiments below, there will be described a writing apparatus and method that can reduce, between at least high emission condition and low emission condition, difference in the state of chromatic aberration of charged particle beams which illuminate a shaping aperture for shaping a beam.

In the embodiments below, there will be described a configuration in which an electron beam is used as an example of a charged particle beam. The charged particle beam is not limited to the electron beam, and other charged particle beam such as an ion beam may also be used. Moreover, a variable shaped beam writing apparatus will be described as an example of a charged particle beam apparatus.

First Embodiment

Figure 1:
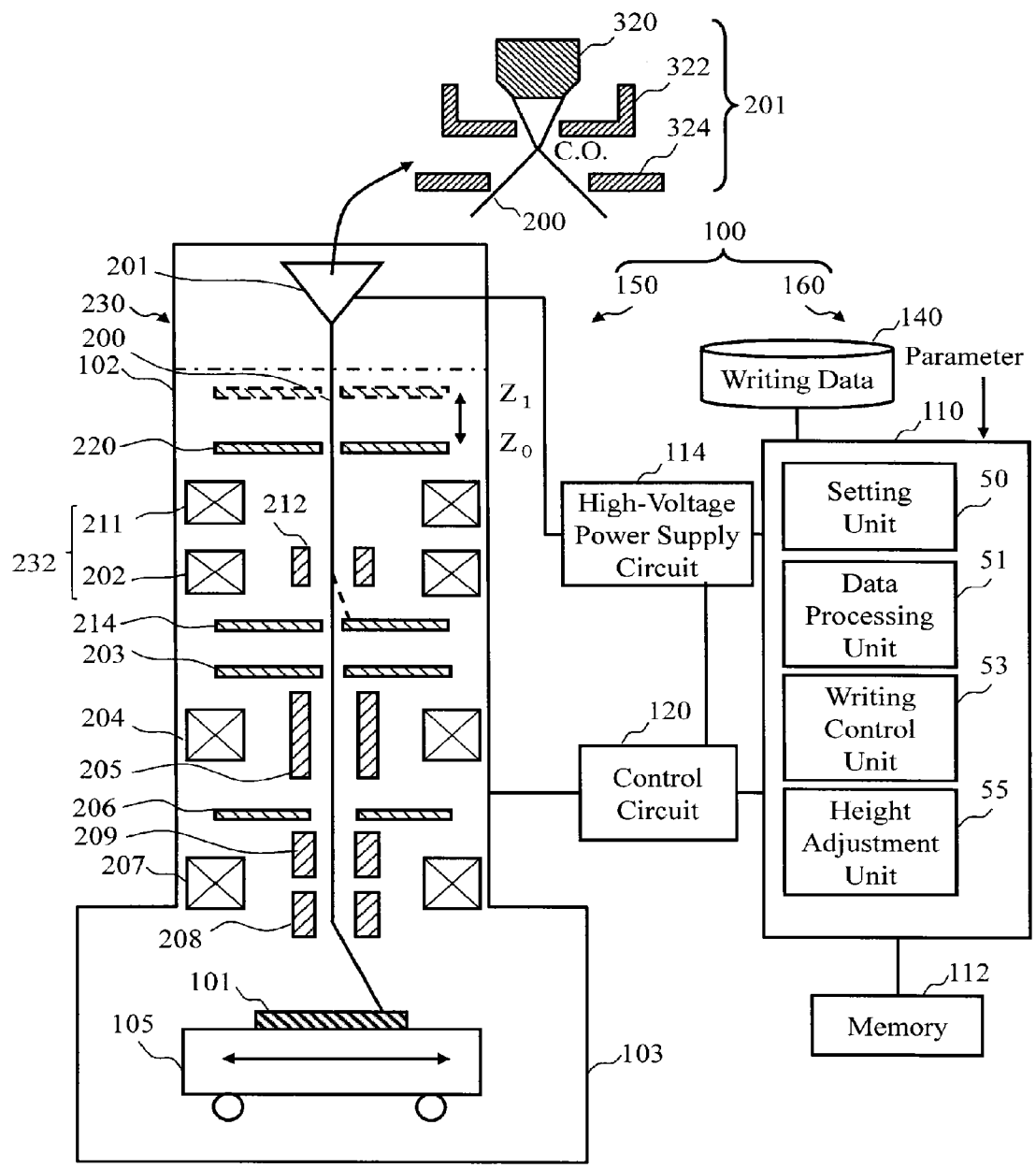
FIG. 1 is a conceptual diagram showing a configuration of a writing apparatus according to a first embodiment.

FIG. 1 is a conceptual diagram showing the configuration of a writing apparatus according to the first embodiment. As shown in FIG. 1, a writing apparatus 100 includes a writing unit 150 and a control unit 160. The writing apparatus 100 is an example of a charged particle beam writing apparatus. Particularly, it is an example of a variable shaped beam (VSB) writing apparatus. The writing unit 150 includes an electron gun mechanism 230, an electron optical column 102 and a writing chamber 103. In the electron gun mechanism 230, an electron gun 201 is arranged. In the electron optical column 102, there are arranged a current-limiting aperture member 220, an electron lens 211, an illumination lens 202 (electron lens), a blanking deflector 212, a blanking aperture member 214, a first shaping aperture member 203, a projection lens 204, a deflector 205, a second shaping aperture member 206, an objective lens 207, a main deflector 208, and a sub deflector 209. In the writing chamber 103, an XY stage 105 is arranged. On the XY stage 105, there is placed a target object or "sample" 101 such as a mask etc. serving as a writing target when writing is carried out. For example, the target object 101 is an exposure mask used for manufacturing semiconductor devices. The target object 101 may be, for example, a mask blank on which resist has been applied and nothing has yet been written. For example, a pair of electrodes is used as the blanking deflector 212.

The current-limiting aperture member 220 (limiting aperture member) is arranged at the downstream side of the electron gun 201 (emission source) with respect to the direction of the optical axis, and has a predetermined sized opening (first opening) formed where the optical axis passes through, for example. The current-limiting aperture member 220 is arranged such that its height position can be selectively adjusted according to an apparatus setting condition selected from a plurality (k) of apparatus setting conditions (apparatus setting modes) to be described later, where k is an integer of 2 or more, $1 \le n$, $m < k$, each of n and m is an integer of 1 or more, and $n+m \le k$.

The electron lens 211 is arranged at the downstream side of the current-limiting aperture member 220 with respect to the direction of the optical axis. The illumination lens 202 is arranged at the downstream side of the electron lens 211 with respect to the direction of the optical axis. That is, the illumination lens 202 (electron lens) is arranged at the downstream side of the current-limiting aperture member 220 with respect to the direction of the optical axis. The illumination optical system 232 (illumination lens system) is composed of the electron lens 211 and the illumination lens 202. The blanking deflector 212 is arranged between the electron lens 211 and the illumination lens 202 with respect to the direction of the optical axis. The first shaping aperture member 203 (shaping aperture member) is arranged at the downstream side of the illumination lens 202 with respect to the direction of the optical axis.

The electron gun 201, serving as an emission source which emits electron beams, includes a cathode 320, a Wehnelt electrode 322, and an anode electrode 324. It is preferable to use, for example, lanthanum hexaboride (LaB$_6$) crystal, etc. as the cathode 320. The Wehnelt electrode 322 is arranged between the cathode 320 and the anode electrode 324. The anode electrode 324 is maintained to be more positive than the cathode 320. For example, the anode electrode 324 is grounded, and its electric potential is set to be ground potential.

The control unit 160 includes a control computer 110, a memory 112, a high-voltage power supply circuit 114, a control circuit 120, and a storage devices 140 such as a magnetic disk drive, etc. The control computer 110, the memory 112, the high-voltage power supply circuit 114, the control circuit 120, and the storage device 140 are connected with each other through a bus (not shown). The high-voltage power supply circuit 114 (electron gun power supply device) is connected to the electron gun 201. The control circuit 120 is connected to the writing mechanism 150 and controls it.

In the control computer 110, there are arranged a setting unit 50, a data processing unit 51, a writing control unit 53, and a height adjustment unit 55. Each of the "units" such as the setting unit 50, the data processing unit 51, the writing control unit 53, and the height adjustment unit 55 includes a processing circuitry. The processing circuitry includes an electric circuit, a computer, a processor, a circuit board, a quantum circuit, or a semiconductor device, for example. Each of the "units" may use a common processing circuitry (same processing circuitry), or different processing circuitries (separate processing circuitries). Input data required in the setting unit 50, the data processing unit 51, the writing control unit 53, and the height adjustment unit 55, and calculated results are stored in the memory 112 each time.

FIG. 1 shows a configuration necessary for explaining the first embodiment. Other configuration elements generally necessary for the writing apparatus 100 may also be included. For example, although a multiple stage deflector of two stages of the main deflector 208 and the sub deflector 209 is herein used for position deflection, a single stage deflector or a multiple stage deflector of three or more stages may also be used for position deflection. Moreover, for example, an input device, such as a mouse and a keyboard, and a monitoring device may be connected to the writing apparatus 100. Although, in the case of FIG. 1, the blanking aperture member 214 is arranged at the upstream side of the first shaping aperture member 203 with respect to the direction of the optical axis, it is not limited thereto, and any position where blanking operation can be performed is acceptable. For example, the blanking aperture member 214 may be arranged at the downstream side of the first shaping aperture member 203 or the second shaping aperture member 206.

Figure 2:
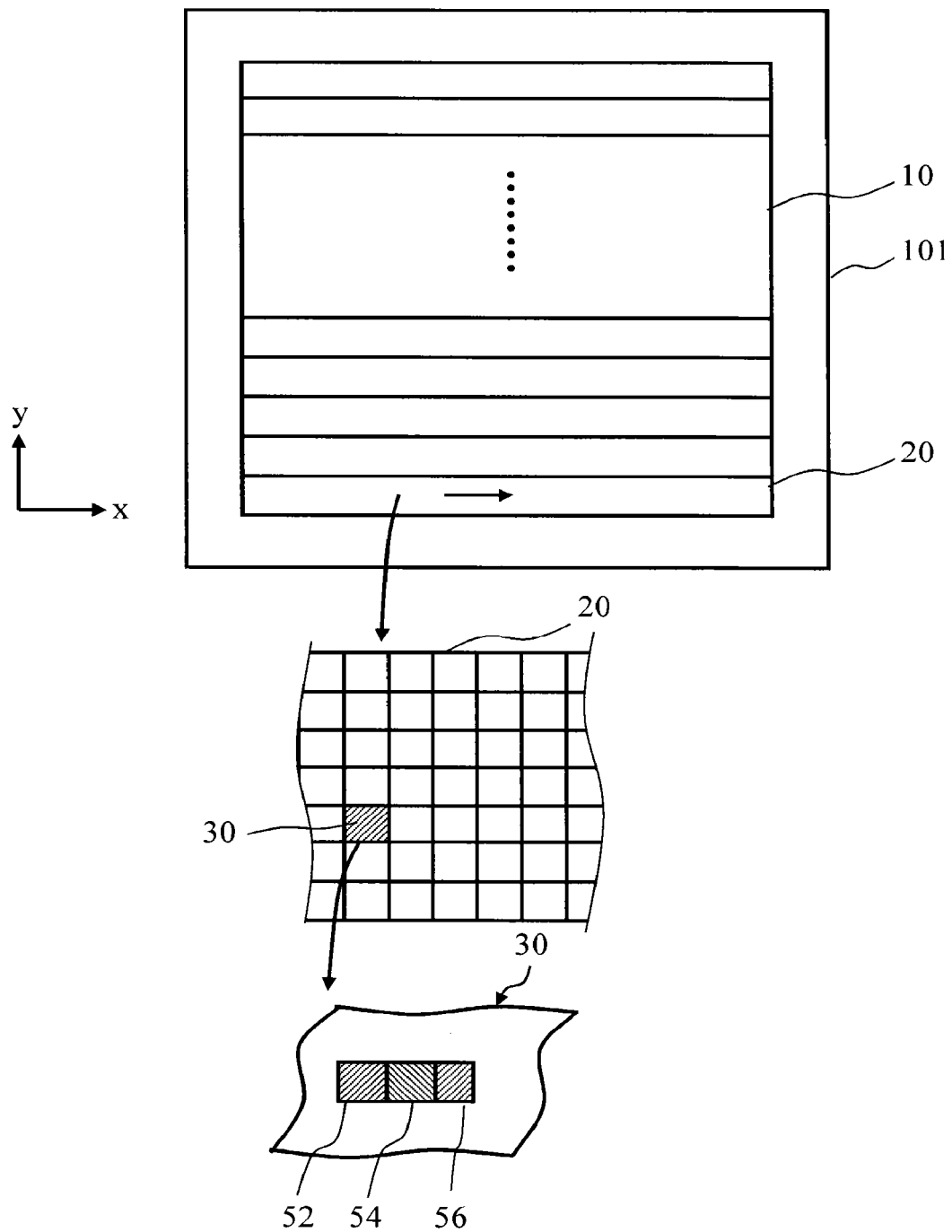
FIG. 2 is a conceptual diagram for explaining each region according to the first embodiment.

FIG. 2 is a conceptual diagram for explaining each region according to the first embodiment. In FIG. 2, a writing region 10 of the target object 101 is virtually divided into a plurality of strip-shaped stripe regions 20 by the width size that can be deflected in the y direction by the main deflector 208. Further, each of the stripe regions 20 is virtually divided into a plurality of subfields (SFs) 30 (small regions) by the size that can be deflected by the sub deflector 209. Shot figures 52, 54, and 56 are written at corresponding shot positions in each SF 30.

A digital signal for blanking control is output from the control circuit 120 to a DAC amplifier (not shown). Then, in the DAC amplifier for blanking control, the digital signal is converted to an analog signal, and amplified to be applied as a deflection voltage to the blanking deflector 212. An electron beam 200 is deflected by this deflection voltage so that the irradiation time (dose) of each shot may be controlled.

A digital signal for controlling main deflection is output from the control circuit 120 to a DAC amplifier (not shown). Then, in the DAC amplifier for controlling main deflection, the digital signal is converted to an analog signal and amplified to be applied as a deflection voltage to the main deflector 208. By this deflection voltage, the electron beam 200 is deflected, and thereby each shot beam is deflected to a reference position in a target SF 30 in the virtually divided mesh like SFs.

A digital signal for controlling sub deflection is output from the control circuit 120 to a DAC amplifier (not shown). Then, in the DAC amplifier for controlling sub deflection, the digital signal is converted to an analog signal and amplified to be applied as a deflection voltage to the sub deflector 209. By this deflection voltage, the electron beam 200 is deflected, and thereby each shot beam is deflected to each shot position in the target SF 30.

The writing apparatus 100 performs writing processing in each stripe region 20 by using a multiple stage deflector of a plurality of stages. Here, as an example, a two-stage deflector composed of the main deflector 208 and the sub deflector 209 is used. While the XY stage 105 is continuously moving in the −x direction, for example, writing is performed in the x direction in the first stripe region 20. After the writing has been finished in the first stripe region 20, continuously writing is performed in the same direction or in the opposite direction in the second stripe region 20. Then, in the same way, writing is performed in the third and subsequent stripe regions 20. The main deflector 208 sequentially deflects the electron beam 200 to a reference position of the SF 30 such that the movement of the XY stage 105 is followed. The sub deflector 209 deflects the electron beam 200 from the reference position of each SF 30 to each shot position of an irradiating beam in the SF 30 concerned. Thus, the sizes of the deflection regions of the main deflector 208 and the sub deflector 209 are different from each other. The SF 30 is the smallest deflection region in the deflection regions of the multiple stage deflector.

If the cathode 320 is heated in the state where a negative acceleration voltage is applied to the cathode 320 and a negative bias voltage is applied to the Wehnelt electrode 322, electrons (electron group) are emitted from the cathode 320. Then, the emitted electrons (electron group) are spread after forming a convergence point (crossover: C.O.) (cathode crossover), and accelerated by the acceleration voltage to become an electron beam advancing toward the anode electrode 324. Then, the electron beam passes through an opening in the anode electrode 324, and thus, the electron beam 200 is emitted from the electron gun 201.

A part of the electron beam 200 emitted from the electron gun 201 (emission unit) passes through the opening with the radius r formed in the current-limiting aperture member 220, and the rest of the beam is blocked by the surface of the current-limiting aperture member 220. In other words, the emission current emitted from the electron gun 201 (emission unit) is limited by the surface of the current-limiting aperture member 220. The electron beam 200 having passed through the current-limiting aperture member 220 is converged by the electron lens 211 at the central height position (an example of a predetermined position) in the blanking deflector 212, and a convergence point (crossover: C.O.) is formed. Then, when the electron beam 200 passes through the blanking deflector 212 arranged at the downstream side of the electron lens 211 with respect to the direction of the optical axis, "beam on" or "beam off" is controlled by the blanking deflector 212 which is controlled by a deflection signal from a DAC amplifier (not shown) for blanking. Expressed in another way, when performing blanking control of switching between "beam on" and "beam off", the blanking deflector 212 deflects the electron beam. Then, the electron beam having been deflected to be in the "beam off" state is blocked by the blanking aperture member 214 (blanking aperture member) arranged at the downstream side of the blanking deflector 212 with respect to the direction of the optical axis. That is, when in the "beam on" state, it is controlled to pass through the blanking aperture member 214, and when in the "beam off" state, it is deflected such that the entire beam is blocked by the blanking aperture member 214. The electron beam 200 that has passed through the blanking aperture member 214 during the period from the time of "beam off" becoming "beam on" to the time of again becoming "beam off" serves as one shot of the electron beam. The blanking deflector 212 controls the direction of the passing electron beam 200 to alternately generate a "beam on" state and a "beam off" state. For example, when in the "beam on" state, a voltage of 0V is applied (or not to apply any voltage) to the blanking deflector 212, and, when in the "beam off" state, a voltage of several V is applied to it. The dose per shot of the electron beam 200 to irradiate the target object 101 is adjusted depending upon an irradiation time t of each shot.

As described above, the electron beam 200 of each shot generated by passing through the blanking deflector 212 and the blanking aperture member 214 irradiates the region including the whole of the opening (second opening), being a quadrangle, of the first shaping aperture member 203 by the illumination lens 202. In other words, the electron beam 200 having passed through the opening (first opening) of the current-limiting aperture member 220 is refracted to illuminate the region including the whole of the opening (second opening) of the first shaping aperture member 203. Here, the electron beam 200 is first shaped to be quadrangular. That is, the region including the whole of the opening (second opening) of the first shaping aperture member 203 is irradiated with the electron beam 200 having been refracted by the illumination lens 202, and then, a part of the electron beam 200 passes through the opening (second opening), thereby shaping the electron beam 200.

After passing through the first shaping aperture member 203, the electron beam 200 of the first aperture image is projected onto the second shaping aperture member 206 by the projection lens 204. The first aperture image on the second shaping aperture member 206 is deflection-controlled by the deflector 205 so as to change (variably shape) the shape and size of the beam. Such variable beam shaping is performed for each shot, and, generally, each shot is shaped to have a different shape and size. Then, after passing through the second shaping aperture member 206, the electron beam 200 of the second aperture image is focused by the objective lens 207, and deflected by the main deflector 208 and the sub deflector 209 to reach a desired position on the target object 101 placed on the XY stage 105 which moves continuously. In other words, an electron beam in the "beam on" state is focused onto the target object 101 by the objective lens 207 which is arranged at the downstream side of the blanking aperture plate 214 with respect to the direction of the optical axis. Expressed in another way, the writing mechanism 150 writes a pattern on the target object 101 by using at least a part of the electron beam shaped by the first shaping aperture member 203. FIG. 1 shows the case of using multiple stage deflection of two stages of the main and sub deflectors for position deflection. In such a case, the main deflector 208 deflects the electron beam 200 of the shot concerned to a reference position in an SF 30 while following the movement of the stage, and the sub deflector 209 deflects the beam of the shot concerned to each irradiation position in the SF. A figure pattern defined in writing data is written by repeating such operations and combining shot figures of respective shots.

As described above, the writing apparatus 100 is requested to deal with (respond to) writing processing based on both the high emission condition (high emission mode (apparatus setting mode)) and the low emission condition (low emission mode (apparatus setting mode)), wherein the high emission mode relatively increases an emission current emitted from the cathode 320 of the electron gun 201 and puts emphasis on throughput, and the low emission mode relatively decreases an emission current and puts emphasis on resolution. However, when the emission current is increased, so-called chromatic aberration becomes worse due to increase of energy dispersion $\Delta E$ by the longitudinal Boersch effect. Accordingly, there is a problem that the states (amounts) of chromatic aberration in both the modes (apparatus setting modes) are different. This results in that the resolution degrades because the states of chromatic aberration of electron beams illuminating the first shaping aperture member 203 arranged at the downstream side become different and shaped beams are affected by such chromatic aberration. Generally, in development and etching processing, which are processes after the target object 101 having been written in the writing apparatus 100, optimization is performed for the resolution of the writing apparatus 100. Consequently, when the writing apparatus 100 is operated with switching the high emission mode and the low emission mode, if chromatic aberration degrades, resolution also degrades due to the chromatic aberration, and thus, the optimization is redone in the development and/or etching processing in the degraded mode. Therefore, it is required that chromatic aberration does not change between the high emission mode and the low emission mode when the writing apparatus 100 is operated with switching both the modes.

Energy dispersion $\Delta E$ due to the Boersch effect can be defined by the following equation (1) using a beam path length L, a current amount I, and a beam emission half angle $\alpha$.

$$\Delta E \propto L^a \cdot I^b / \alpha^c \tag{1}$$

The multipliers a to c are positive constants determined based on an optical system. Generally, if variation (energy dispersion $\Delta E$) of kinetic energy of an electron included in the electron beam 200 becomes large, chromatic aberration on the surface of the first shaping aperture member 203 becomes greater, and thus, resolution becomes degraded. On the other hand, the longer the path length L of the electron beam 200 becomes, the longer the time for electrons to generate Coulomb interaction becomes. Therefore, as shown in the equation (1), the longer the path length L of the electron beam 200 becomes, the larger the energy dispersion $\Delta E$ becomes. Moreover, the larger the current amount I becomes, the more the number of interaction parties in electrons with respect to the Coulomb interaction becomes. Therefore, as shown in the equation (1), the larger the current amount I of the electron beam 200 becomes, the larger the energy dispersion $\Delta E$ becomes. Then, according to the first embodiment, utilizing the relation described above, it is configured so that the energy dispersion may substantially be constant regardless of the apparatus setting mode. It will be specifically described below.

Figures 3A, 3B:
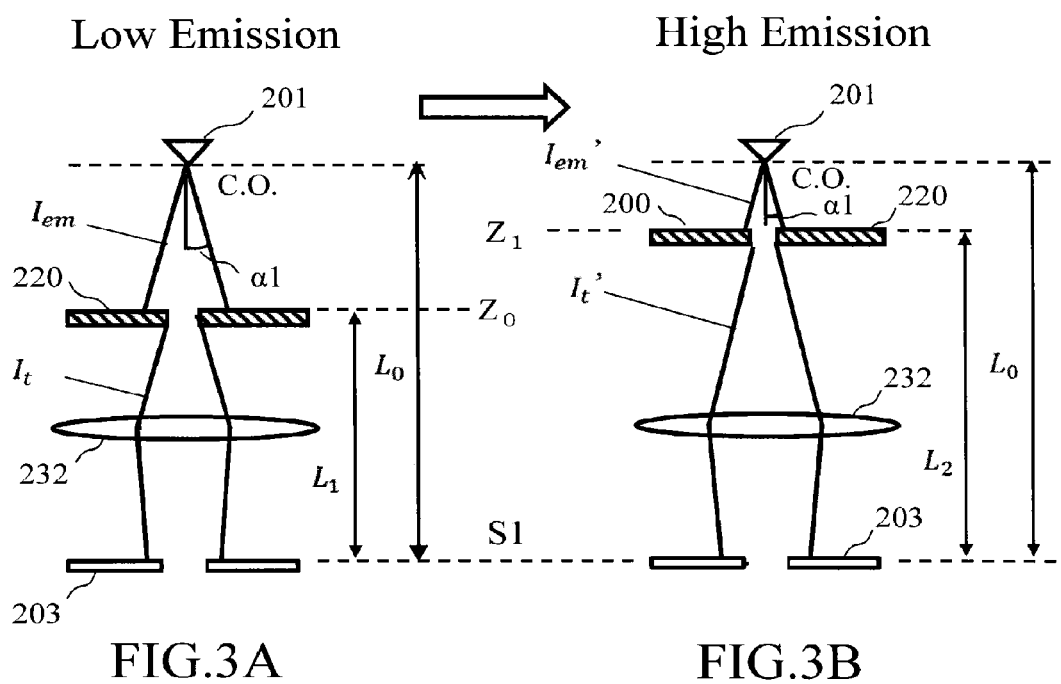
FIGS. 3A and 3B show examples of positional relationship of each structure from an electron gun to a shaping aperture member in each apparatus setting mode according the first embodiment.

FIGS. 3A and 3B show examples of positional relationship of each structure from the electron gun to the shaping aperture member in each apparatus setting mode according the first embodiment. FIG. 3A shows an example of positional relationship of the electron gun 201, the current-limiting aperture member 220, the illumination optical system 232, and the first shaping aperture member 203 in a low emission mode. FIG. 3B shows an example of positional relationship of the electron gun 201, the current-limiting aperture member 220, the illumination optical system 232, and the first shaping aperture member 203 in a high emission mode. As shown in FIGS. 3A and 3B, the height position of the current-limiting aperture member 220 in the high emission mode is adjusted to be higher than that of the low emission mode. The way of adjustment will be described below.

In FIG. 3A, the ratio between the emission current $I_{em}$ emitted from the electron gun 201 and the emission current $I_t$ after having been current-limited by the current-limiting aperture member 220 in a low emission mode can be defined by the following equation (2).

$$I_t / I_{em} = \{r / (\alpha_1 (L_0 - L_1))\}^2 \tag{2}$$

In the equation (2), there are used the radius r of the opening of the current-limiting aperture member 220, the emission half angle $\alpha_1$ of the electron gun 201, the distance $L_0$ from the electron gun 201 (crossover formation position in the electron gun 201) to the surface (top side) of the first shaping aperture member 203, and the distance $L_1$ from the surface (top side) of the current-limiting aperture member 220 arranged at a height position $Z_0$ to the surface (top side) of the first shaping aperture member 203.

Similarly, in FIG. 3B, the ratio between the emission current $I_{em}'$ emitted from the electron gun 201 and the emission current $I_t'$ after having been current-limited by the current-limiting aperture member 220 in a high emission mode can be defined by the following equation (3).

$$I_t' / I_{em}' = \{r / (\alpha_1 (L_0 - L_2))\}^2 \tag{3}$$

Similarly, in the equation (3), there are used the radius r of the opening of the current-limiting aperture member 220, the emission half angle $\alpha_1$ of the electron gun 201, the distance $L_0$ from the electron gun 201 (crossover formation position in the electron gun 201) to the surface (top side) of the first shaping aperture member 203, and the distance $L_2$ from the surface (top side) of the current-limiting aperture member 220 arranged at a height position $Z_1$ to the surface (top side) of the first shaping aperture member 203.

With respect to the square of the energy dispersion $\Delta E$ at the surface (top side) of the first shaping aperture member 203, it can be defined by a square sum of the energy dispersion $\Delta E_{em}$ in the range from the electron gun 201 (crossover formation position in the electron gun 201) to the surface (top side) of the current-limiting aperture member 220 and the energy dispersion $\Delta E_t$ in the range from the surface (top side) of the current-limiting aperture member 220 to the surface (top side) of the first shaping aperture member 203. Therefore, in the case of setting the energy dispersion $\Delta E$ at the surface (top side) of the first shaping aperture member 203 to be the same between the low emission mode and the high emission mode, the following equation (4) can be satisfied.

$$\Delta E_{em}(L_0 - L_1, I_{em})^2 + \Delta E_t(L_1, I_t)^2 = \Delta E_{em}(L_0 - L_2, I_{em}')^2 + \Delta E_t(L_2, I_t')^2 \tag{4}$$

As shown in the equation (1), the energy dispersion $\Delta E$ depends on the path length L, the current amount I, and the emission half angle $\alpha$. Since the emission half angle $\alpha$ is the same, $\Delta E_{em}$ in the low emission mode depends on $L_0 - L_1$ and $I_{em}$. $\Delta E_t$ in the low emission mode depends on $L_1$ and $I_t$. Similarly, $\Delta E_{em}$ in the high emission mode depends on $L_0 - L_2$ and $I_{em}'$. $\Delta E_t$ in the high emission mode depends on $L_2$ and $I_t'$.

Therefore, the height position of each structure should be adjusted so that the equations (3) and (4), or the equations (2) and (4) may be satisfied. In other words, if the distance $L_1$ (or $L_2$) for determining the height position of each structure and the current value $I_t$ (or $I_t'$) in one of the low emission mode and the high emission mode, and the emission current values $I_{em}$ and $I_{em}'$ in both the modes have already been specified, the distance $L_2$ (or $L_1$) for determining the height position and the current value $I_t'$ (or $I_t$) in the other mode can be specified. Since $L_0$ is common, if, for example, the emission current values $I_{em}$ and $I_{em}'$ in both the modes, and the distance $L_1$ from the surface (top side) of the current-limiting aperture member 220 to the surface (top side) of the first shaping aperture member 203 and the current value $I_t$ in the low emission mode have already been specified, the distance $L_2$ from the surface (top side) of the current-limiting aperture member 220 to the surface (top side) of the first shaping aperture member 203 and the current value $I_t'$ in the high emission mode can be specified. Conversely, for example, if the emission current values $I_{em}$ and $I_{em}'$ in both the modes, and the distance $L_2$ from the surface (top side) of the current-limiting aperture member 220 to the surface (top side) of the first shaping aperture member 203 and the current value $I_t'$ in the high emission mode have already been specified, the distance $L_1$ from the surface (top side) of the current-limiting aperture member 220 to the surface (top side) of the first shaping aperture member 203 and the current value $I_t$ in the low emission mode can be specified. Since the energy dispersion $\Delta E$ can be specified by each optical system while depending on the path length L, the current amount I, and the emission half angle $\alpha$, values that satisfy the equations (2) to (4) should be obtained by simulation or experiment for each optical system arranged in the writing apparatus 100.

Figure 4:
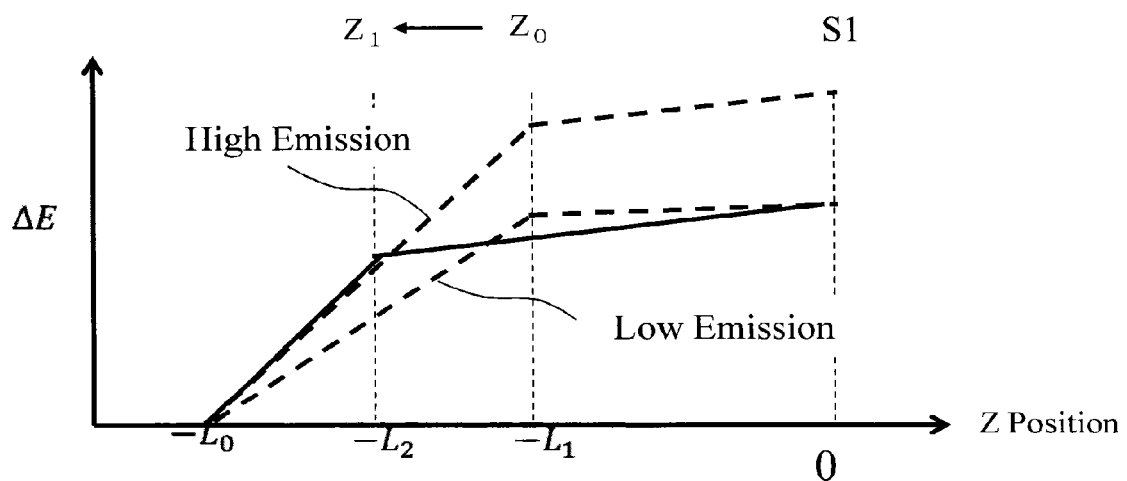
FIG. 4 shows an example of relationship between each position from an electron gun to a shaping aperture member and energy dispersion, in each apparatus setting mode according to the first embodiment.

FIG. 4 shows an example of the relationship between each position from the electron gun to the shaping aperture member and energy dispersion, in each apparatus setting mode according to the first embodiment. In the graph of FIG. 4, the ordinate axis represents energy dispersion, and the abscissa axis represents a height position (distance). In the graph of FIG. 4, the height of the surface (top side) of the first shaping aperture member 203 is defined to be "0" (zero), and the distance from the surface (top side) of the first shaping aperture member 203 to the electron gun 201 is defined to be $-L_0$. The graph of FIG. 4 shows the case where the multiplier "a" of the equation (1) is 1, and, in other words, where the energy dispersion ΔE is in linear proportion to the distance L. Dotted lines of FIG. 4 show the case where the height position of the current-limiting aperture member 220 is set to be fixed (height $Z_0$) in the low emission mode and the high emission mode. As shown by the dotted line of FIG. 4, in the range from the electron gun 201 to the current-limiting aperture member 220 (height $Z_0$), the energy dispersion ΔE increases with a gradient corresponding to the amount of difference between the larger emission current in the high emission mode and the smaller emission current in the low emission mode. Then, even after the current has been limited by the current-limiting aperture member 220 (height $Z_0$), the energy dispersion ΔE increases with a gradient corresponding to the amount of difference between the larger emission current in the high emission mode and the smaller emission current in the low emission mode. Consequently, the value of the energy dispersion ΔE at the surface (top side) of the first shaping aperture member 203 is different between the high emission mode and the low emission mode. Thus, according to the first embodiment, the height position of the current-limiting aperture member 220 is changed to $Z_1$ from $Z_0$ so that the value of the energy dispersion ΔE at the surface (top side) of the first shaping aperture member 203 may be the same between the high emission mode and the low emission mode. Then, as shown by the solid line in FIG. 4, in the range from the electron gun 201 to the current-limiting aperture member 220 (height $Z_1$), the energy dispersion ΔE increases with a gradient being the same as that before changing the height in the high emission mode. However, in the stage where the value of the energy dispersion ΔE in the high emission mode is still smaller than that at the surface of the current-limiting aperture member 220 (height $Z_0$) in the low emission mode, the current in the high emission mode is limited by the current-limiting aperture member 220 (height $Z_1$). Particularly, the height $Z_1$ of the current-limiting aperture member 220 is adjusted in order that the value of the energy dispersion ΔE at the surface (top side) of the first shaping aperture member 203 in the high emission mode may be coincident with that in the low emission mode. Thus, the value of the energy dispersion ΔE at the surface (top side) of the first shaping aperture member 203 can be the same between the low emission mode and the high emission mode.

With respect to the apparatus setting mode, it is not limited to the two modes of the high emission mode and the low emission mode. For example, it is possible to perform switching among the first mode (condition) to the k-th mode (condition), (where k is an integer greater than or equal to 2). In such a case, between the n-th mode (condition) (where n<k and n is an integer greater than or equal to 1) and the (n+m)th mode (condition) (where n+m≤k and m is an integer greater than or equal to 1), the height position is set (adjusted) as described below. The n-th height position and the (n+m)th height position are set (adjusted) so that the energy dispersion ΔE of the electron beam 200 on the first shaping aperture member 203 (shaping aperture member) may be the same between the case where the current-limiting aperture member 220 is irradiated with the electron beam 200 based on the n-th condition (n-th mode) in the state where the current-limiting aperture member 220 (limiting aperture member) has been adjusted to the n-th height position and the case where the current-limiting aperture member 220 is irradiated with the electron beam 200 based on the (n+m)th condition ((n+m)th mode) in the state where the current-limiting aperture member 220 has been adjusted to the (n+m)th height position. As an example of the modes from the first mode (condition) to the k-th mode (where k is an integer greater than or equal to 2), the case where the emission current is set while being sorted into k types can be cited, for example.

As described above, the current-limiting aperture member 220 is arranged such that its height position can be selectively adjusted, according to the condition, to be the n-th height position (where n is an integer greater than or equal to 1) based on the n-th condition (apparatus setting mode) of the emission current value of the electron beam 200, or the (n+m)th height position (where m is an integer greater than or equal to 1), being different from the n-th height position, based on the (n+m)th condition (apparatus setting mode) of the emission current value.

Figure 5:
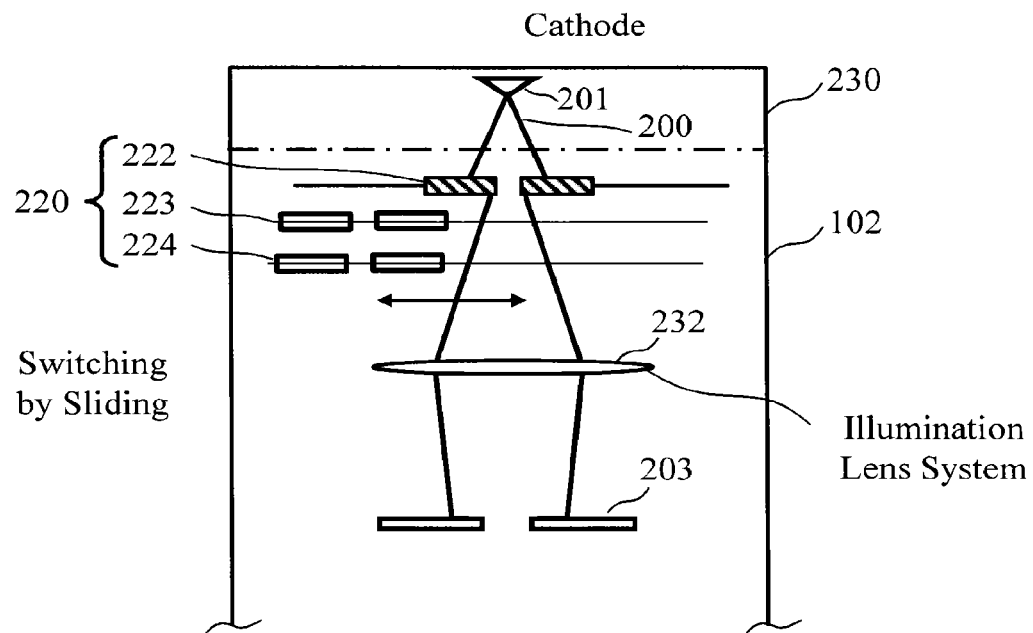
FIG. 5 shows an example of a current-limiting aperture member according to the first embodiment.

FIG. 5 shows an example of a current-limiting aperture member according to the first embodiment. As shown in FIG. 5, the current-limiting aperture member 220 includes multiple stages of aperture members 222, 223, and 224 (limiting aperture members) having different height positions. The height position of the current-limiting aperture member 220 is adjusted by performing replacement among the aperture members 222, 223, and 224 in multiple stages. In the case of FIG. 5, one of the aperture members 222, 223, and 224 in multiple stages is slid to the central part (optical axis side) of the electron optical column 102. Then, another of the aperture members 222, 223, and 224 which has already been arranged in the central part (optical axis side) of the electron optical column 102 should be slid to the outer peripheral side of the electron optical column 102. The sliding mechanism may be manual or automatic. Since the inside of the electron optical column 102 is maintained to be in a vacuum state by a vacuum pump (not shown) at the time of exposure, it is preferable for the sliding mechanism to be configured such that the aperture members can be moved even when the inside of the electron optical column 102 is not exposed to the atmosphere. For example, a plurality of cylinders (not shown) are arranged, and then, each of the aperture members 222, 223, and 224 is individually fixed to the piston part of each cylinder. By extending the piston of the cylinder corresponding to a selected aperture member and contracting/returning the pistons of cylinders corresponding to the other remaining aperture members, it becomes possible to move the selected one of the aperture members 222, 223, and 224 to the central part (optical axis side) of the electron optical column 102. This cylinder operation may be manual or automatic. However, it is not limited to such a configuration. It is also preferable to perform movement such that a selected one of the aperture members 222, 223, and 224 is manually replaced by an unselected one after the inside of the electron optical column 102 has been exposed to the atmosphere.

Figure 6:
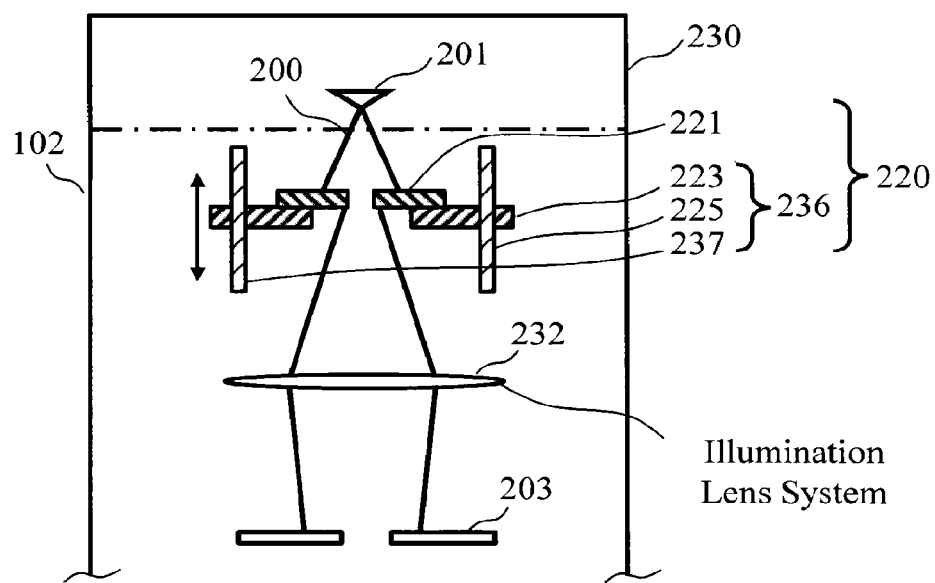
FIG. 6 shows another example of a current-limiting aperture member according to the first embodiment.

FIG. 6 shows another example of a current-limiting aperture member according to the first embodiment. As shown in FIG. 6, the current-limiting aperture member 220 includes the aperture member 221 and an elevating mechanism 236 that can elevate the height position of the aperture member 221. The elevating mechanism 236 is supported, for example, by a support member 223, a ball screw 225, and a shaft 237. For example, there are formed a plurality of openings through each of which the ball screw 225 and the shaft 237 penetrate to be arranged in the support member 223. For example, a female screw is formed at the ball screw 225 side of the support member 223, to be engaged with the ball screw 225 to perform supporting. For example, a slide bearing (not shown) is arranged at the shaft 237 side of the support member 223, to perform supporting by the shaft 237 through the slide bearing. For example, the support member 223 is elevated by rotating the ball screw 225 by using a motor etc. (not shown). For example, by arranging the aperture member 221 on the support member 223, the height position of the aperture member 221 (limiting aperture member) can be adjusted by the elevating mechanism 236.

Figure 7:
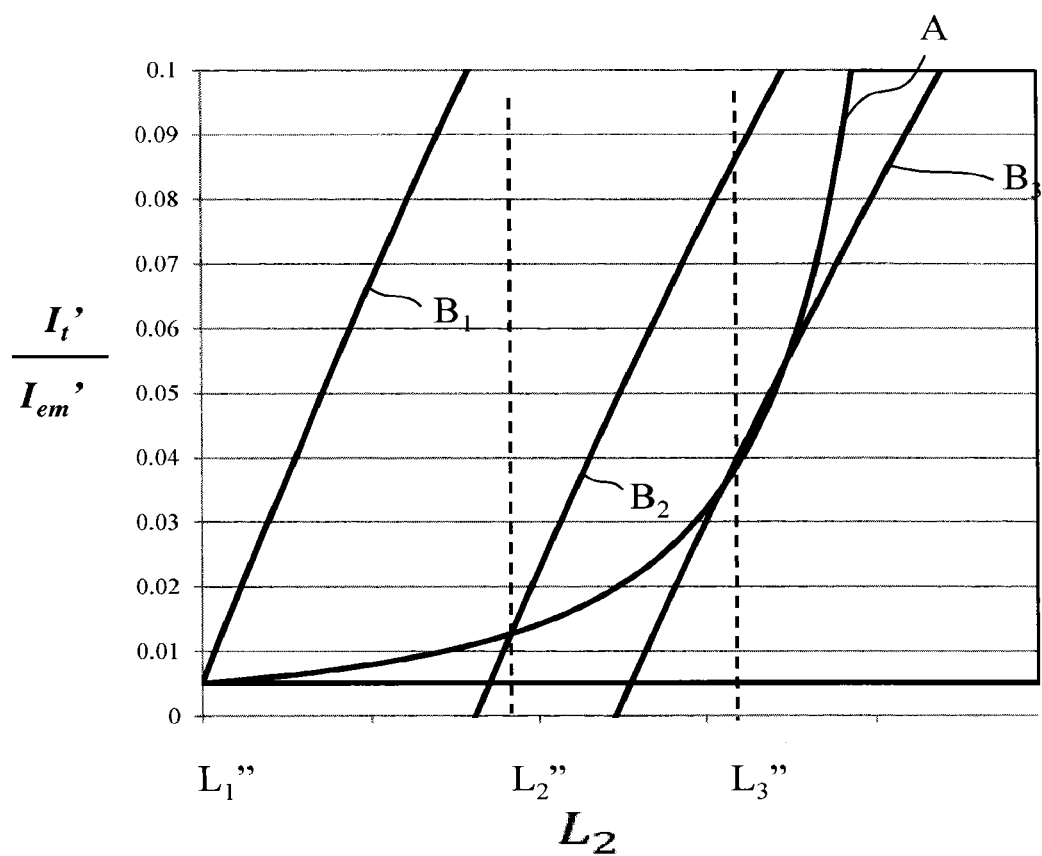
FIG. 7 shows an example of a method for height adjustment according to the first embodiment.

FIG. 7 shows an example of a method for height adjustment according to the first embodiment. In FIG. 7, the ordinate axis represents the ratio ($I_t/I_{em}'$) between the current value $I_t$ in the range from the surface (top side) of the current-limiting aperture member 220 to the surface (top side) of the first shaping aperture member 203, and the emission current value $I_{em}'$ in the high emission mode. The abscissa axis represents the distance $L_2$ from the surface (top side) of the current-limiting aperture member 220 to the surface (top side) of the first shaping aperture member 203 in the high emission mode. In the case of FIG. 7, the square of the energy dispersion $\Delta E$, namely $\Delta E^2$, is assumed to be $\Delta E^2 = I \times L$. Moreover, in the case of FIG. 7, for example, it is assumed that the distance $L_0$ from the electron gun 201 to the surface (top side) of the current-limiting aperture member 220, the distance $L_1$ from the surface (top side) of the current-limiting aperture member 220 to the surface (top side) of the first shaping aperture member 203 in the low emission mode, and the emission current value $I_{em}$ in the low emission mode have already been set (specified). Moreover, it is assumed that the radius r of the opening of the current-limiting aperture member 220, and the emission half angle $\alpha_1$ of the electron beam 200 from the electron gun 201 have already been set (specified). In that case, the graph A satisfies the equation (3). The graph $B_1$ satisfies the equation (4) in the case where the ratio ($I_{em}'/I_{em}$) between the emission current value $I_{em}'$ in the high emission mode and the emission current value $I_{em}$ in the low emission mode is 1.0. Moreover, the graph $B_2$ satisfies the equation (4) in the case of the ratio ($I_{em}'/I_{em}$) being 1.5. The graph $B_3$ satisfies the equation (4) in the case of the ratio ($I_{em}'/I_{em}$) being 2.0.

For example, if $I_{em}'$ is selected to satisfy that the ratio ($I_{em}'/I_{em}$) between the emission current value $I_{em}'$ in the high emission mode and the emission current value $I_{em}$ in the low emission mode is 1.5, the surface (top side) of the current-limiting aperture member 220 should be adjusted to the height position being the distance $L_2(=L_2'')$ of the intersection between the graph A and graph $B_2$ in the high emission mode. If $I_{em}'$ is selected to satisfy that the ratio ($I_{em}'/I_{em}$) is 2.0, the surface (top side) of the current-limiting aperture member 220 should be adjusted to the height position being the distance $L_2(=L_3'')$ of the intersection between the graph A and graph $B_3$ in the high emission mode. Needless to say, it is not necessary to change the height of the surface (top side) of the current-limiting aperture member 220 when the ratio ($I_{em}'/I_{em}$) is 1.0, because the emission current is not changed and therefore, no mode change is performed.

Figure 8:
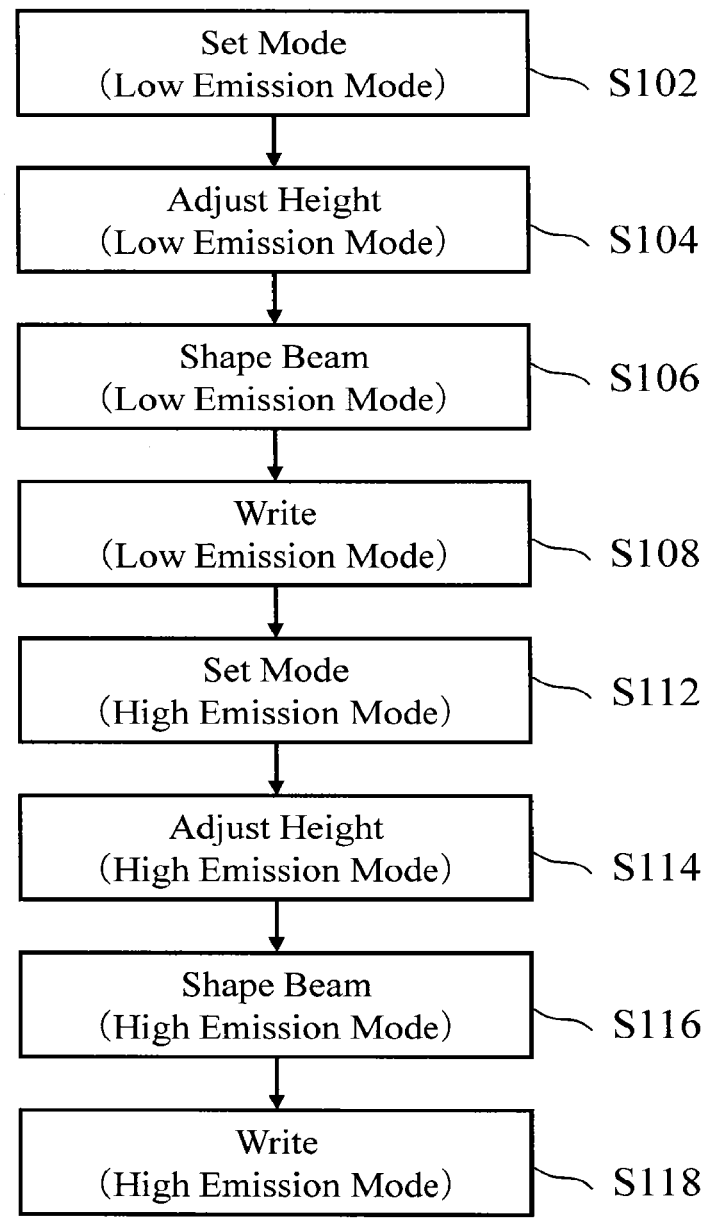
FIG. 8 is a flowchart showing main steps of a writing method according to the first embodiment.

FIG. 8 is a flowchart showing main steps of a writing method according to the first embodiment. As shown in FIG. 8, the writing method of the first embodiment executes a series of steps: a mode setting step (S102), a height adjustment step (S104), a beam shaping step (S106), a writing step (S108), a mode setting step (S112), a height adjustment step (S114), a beam shaping step (S116), and a writing step (S118).

In the mode setting step (S102), the setting unit 50 sets the n-th condition of the emission current value of an electron beam, (where n is an integer greater than or equal to 1). As the n-th condition, for example, a low emission mode which makes an emission current value relatively low is set. The mode information is output to the high-voltage power supply circuit 114.

In the height adjustment step (S104), based on that the n-th condition has been set, the height adjustment unit 55 adjusts the height position of the surface (top side) of the current-limiting aperture member 220 to the n-th height position. For example, the height adjustment unit 55 outputs a control signal for controlling height to the control circuit 120. Then, in the case of using the sliding mechanism of FIG. 5, the control circuit 120 slides one of the plurality of aperture members 222, 223, and 224 (e.g., the aperture member 224), which has the height concerned, such that its opening is located on the optical axis. In the case of using the elevating mechanism of FIG. 6, the height position of the aperture member 221 is moved to the height based on the control signal. In the case of FIG. 3A, it is adjusted to the height position $Z_0$.

In the beam shaping step (S106), the writing mechanism 150 shapes an electron beam, under the control of the writing control unit 53. Specifically, in the state where the surface (top side) of the current-limiting aperture member 220 has been adjusted to the n-th height position, the surface of the first shaping aperture member 203 is irradiated with the electron beam 200 in the n-th condition, and a part of the electron beam 200 passes through the opening (second opening) of the first shaping aperture member 203, thereby shaping an electron beam.

In the writing step (S108), under the control of the writing control unit 53, the writing mechanism 150 performs the n-th writing processing by using at least a part of the electron beam shaped under the n-th condition. The beam shaping step (S106) and the writing step (S108) are performed as continuous operations. Respective detailed operations are described below. First, the data processing unit 51 reads writing data for a low emission mode (n-th condition) from the storage device 140, and performs data conversion processing of several steps in order to generate shot data. Information, such as a figure code, coordinates, size, etc. of a figure pattern is defined in the writing data. In the writing apparatus 100, since there is a limit to the size that can be formed by one shot beam, a figure pattern is divided into a plurality of shot figures each having the size that can be irradiated by one shot beam. Shot data is generated for each shot figure. Information, such as a figure code, coordinates, size, irradiation time, etc. of the shot figure concerned is defined in the shot data. The generated shot data is output to the control circuit 120. Under the control of the writing control unit 53, the control circuit 120 controls the writing mechanism 150 and the high-voltage power supply circuit 114.

Regarding the electron beam 200 emitted from the electron gun 201 (emission unit), which has been controlled to be a low emission current value by the high-voltage power supply circuit 120, as described above, a part of the beam passes through the opening formed in the current-limiting aperture member 220, and the rest of the beam is blocked by the surface of the current-limiting aperture member 220. The electron beam 200 having passed the current-limiting aperture member 220 passes through the electron lens 211, the blanking deflector 212, and the blanking aperture member 214 as described above. Then, each shot of the electron beam 200, being in the "beam on" state, is formed based on the shot data. Then, as described above, the electron beam 200 of each shot being in the "beam on" state illuminates the region including the whole of the opening of the first shaping aperture member 203 having a rectangular hole by the illumination lens 202. As described above, the electron beam 200 is shaped by letting a part of the electron beam 200 pass through the opening of the first shaping aperture member 203.

After passing through the first shaping aperture member 203, the shape and size of the electron beam 200 of the first aperture image is changed (variably shaped) by the second shaping aperture member 206, based on the shot data as described above. Then, after passing through the second shaping aperture member 206, the electron beam 200 of the second aperture image is focused by the objective lens 207, and deflected by the main deflector 208 and the sub deflector 209 to reach a desired position on the target object 101 placed on the XY stage 105 which moves continuously, as described above.

In this way, writing processing in the low emission mode is performed. Next, performing writing processing in the high emission mode is described below.

In the mode setting step (S112), the setting unit 50 resets the n-th condition to the (n+m)th condition (where m is an integer greater than or equal to 1) whose emission current value is different from that of the n-th condition. As the (n+m)th condition, a high emission mode which makes an emission current value relatively high is set, for example. Such mode information is output to the high-voltage power supply circuit 114.

In the height adjustment step (S114), based on that the condition has been reset to the (n+m)th condition, the height adjustment unit 55 readjusts the height position of the current-limiting aperture member 220 from the n-th height position having been adjusted to the (n+m)th height position. For example, the height adjustment unit 55 outputs a control signal for controlling height to the control circuit 120. Then, in the case of using the sliding mechanism of FIG. 5, the control circuit 120 slides one of the plurality of aperture members 222, 223, and 224 (e.g., the aperture member 222), which has the height concerned, such that its opening is located on the optical axis. In the case of using the elevating mechanism of FIG. 6, the height position of the aperture member 221 is moved to the height based on the control signal. In the case of FIG. 3B, it is adjusted to the height position $Z_1$.

In the beam shaping step (S116), the writing mechanism 150 shapes an electron beam, under the control of the writing control unit 53. Specifically, in the state where the surface (top side) of the current-limiting aperture member 220 has been readjusted to the (n+m)th height position, the surface of the first shaping aperture member 203 is irradiated with the electron beam 200 in the (n+m)th condition, and a part of the electron beam 200 passes through the opening (second opening) of the first shaping aperture member 203, thereby shaping an electron beam.

In the writing step (S118), under the control of the writing control unit 53, the writing mechanism 150 performs the (n+m)th writing processing by using at least a part of the electron beam shaped under the (n+m)th condition. The beam shaping step (S116) and the writing step (S118) are performed as continuous operations. Respective detailed operations are described below. First, the data processing unit 51 reads writing data for a high emission mode ((n+m)th condition) from the storage device 140, and performs data conversion processing of several steps in order to generate shot data. The subsequent operations are the same as those of the low emission mode.

Regarding the electron beam 200 emitted from the electron gun 201 (emission unit), which has been controlled to be a high emission current value by the high-voltage power supply circuit 120, as described above, a part of the beam passes through the opening formed in the current-limiting aperture member 220, and the rest of the beam is blocked by the surface of the current-limiting aperture member 220. The electron beam 200 having passed the current-limiting aperture member 220 passes through the electron lens 211, the blanking deflector 212, and the blanking aperture member 214 as described above. Then, each shot of the electron beam 200, being in the "beam on" state, is formed based on the shot data. Then, as described above, the electron beam 200 of each shot being in the "beam on" state illuminates the region including the whole of the opening of the first shaping aperture member 203 having a rectangular hole by the illumination lens 202. As described above, the electron beam 200 is shaped by letting a part of the electron beam 200 pass through the opening of the first shaping aperture member 203. The subsequent operations are the same as those of the low emission mode.

Thus, according to the first embodiment, it is possible to make the value of the energy dispersion $\Delta E$ of the electron beam 200 on the first shaping aperture member 203 the same (or closer to each other) based on any apparatus setting condition (apparatus setting mode) in a plurality (k) of apparatus setting conditions (apparatus setting modes). Therefore, difference in the state of chromatic aberration of the electron beam 200 illuminating the first shaping aperture member 203 can be eliminated or reduced. Between, at least, the high emission condition and the low emission condition, it is possible to reduce the difference in the state of chromatic aberration of charged particle beams illuminating a shaping aperture for shaping beams.

Second Embodiment

In the first embodiment, there has been described the case where the apparatus setting condition is changed by altering the emission current value of an electron beam emitted from the electron gun 201. However, the apparatus setting condition that changes the value of the energy dispersion $\Delta E$ of the electron beam 200 on the first shaping aperture member 203 is not limited to the case described above. According to the second embodiment, there will be described the case where the height position of the electron gun 201 itself is changed.

As described above, in terms of putting emphasis on throughput, luminance of the cathode 320 of the electron gun 201 should be increased. However, if the luminance of the cathode 320 of the electron gun 201 is increased, resolution becomes degraded because cathode conditions such as a crossover diameter (or radius), etc. of an electron beam just after the cathode emission may change.

On the other hand, resolution depends on electron optical aberration, and electron optical aberration is in proportion to power (exponentiation) of a convergence half angle. Then, the convergence half angle depends on a crossover radius of an electron beam. Therefore, in terms of putting emphasis on resolution, in order to reduce the convergence half angle, it is studied to decrease the crossover radius of a beam by focusing electron beam 200 emitted from the electron gun 201 while strengthening the excitation of the illumination lens 202.

Then, although it is necessary to increase the excitation of the illumination lens 202 as much as possible for reducing the convergence half angle, there is a limit in increasing a magnetic flux density due to magnetic saturation, etc. of pole piece material used for the illumination lens 202. Therefore, there is also a limit in increasing the excitation of the illumination lens 202 in accordance with the limit of the magnetic flux density. Accordingly, there is also a limit in focusing an electron beam by controlling the illumination lens 202, and thus, there is also a limit in reducing the convergence half angle. Consequently, there is a problem in that resolution needed for development of next-generation lithography may not be acquired.

Furthermore, if the convergence half angle is made small, the current density of a beam becomes small. Then, if the current density is small, writing time needs to be long, and thus resulting in a problem that the throughput degrades.

The problem described above can be solved by adjusting the height of the electron gun 201 as explained below.

Figure 9:
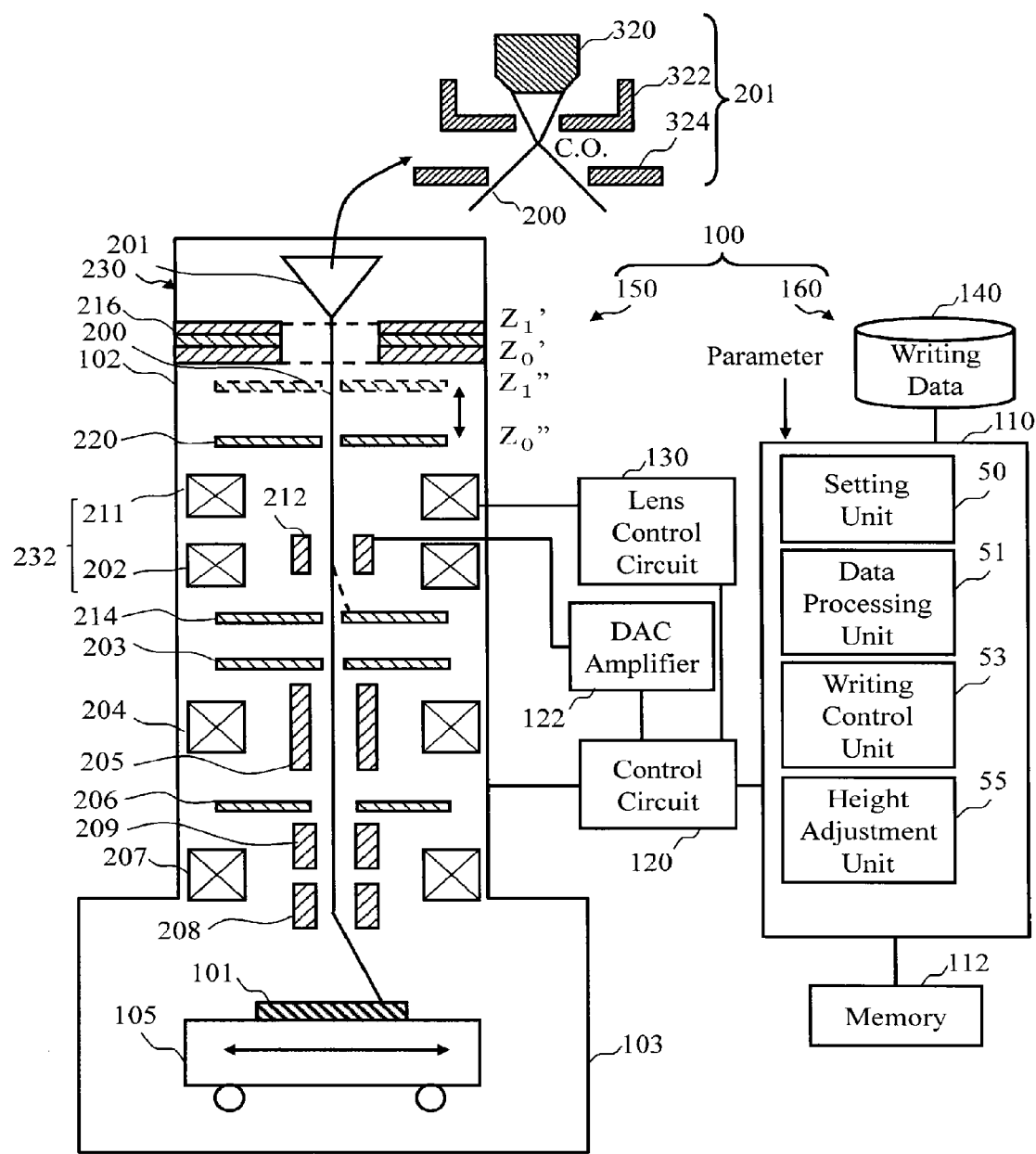
FIG. 9 is a conceptual diagram showing the structure of a writing apparatus according to a second embodiment.

FIG. 9 is a conceptual diagram showing the structure of a writing apparatus according to the second embodiment. As shown in FIG. 9, the writing mechanism 150 further includes a height adjustment mechanism 216 in addition to the electron gun mechanism 230, the electron optical column 102, and the writing chamber 103. The control unit 160 further includes a DAC (digital analog converter) amplifier 122 and a lens control circuit 130. The other structure is the same as that in FIG. 1. In FIG. 9, illustration of the high-voltage power supply circuit 114 is omitted.

The height adjustment mechanism 216 (height adjustment unit) is arranged at the target object side (hereinafter referred to as a downstream side) of the electron gun mechanism 230 with respect to the direction of the optical axis, and variably adjusts the height position of the electron gun mechanism 230. The electron optical column 102 is arranged at the downstream side of the height adjustment mechanism 216 with respect to the direction of the optical axis. In other words, the height adjustment mechanism 216 is arranged between the electron gun mechanism 230 and the electron optical column 102. That is, the current-limiting aperture member 220, the electron lens 211, the illumination lens 202, the blanking deflector 212, the blanking aperture member 214, the first shaping aperture member 203, the projection lens 204, the deflector 205, the second shaping aperture member 206, the objective lens 207, the main deflector 208 and the sub deflector 209 are arranged at the downstream side of the height adjustment mechanism 216 with respect to the direction of the optical axis. The electron lens 211 is arranged between the height adjustment mechanism 216 and the blanking deflector 212.

FIG. 9 shows a configuration necessary for explaining the second embodiment. Other configuration elements generally necessary for the writing apparatus 100 may also be included. The contents of the second embodiment are the same as those of the first embodiment except for what is specifically described below.

Figures 10A, 10B:
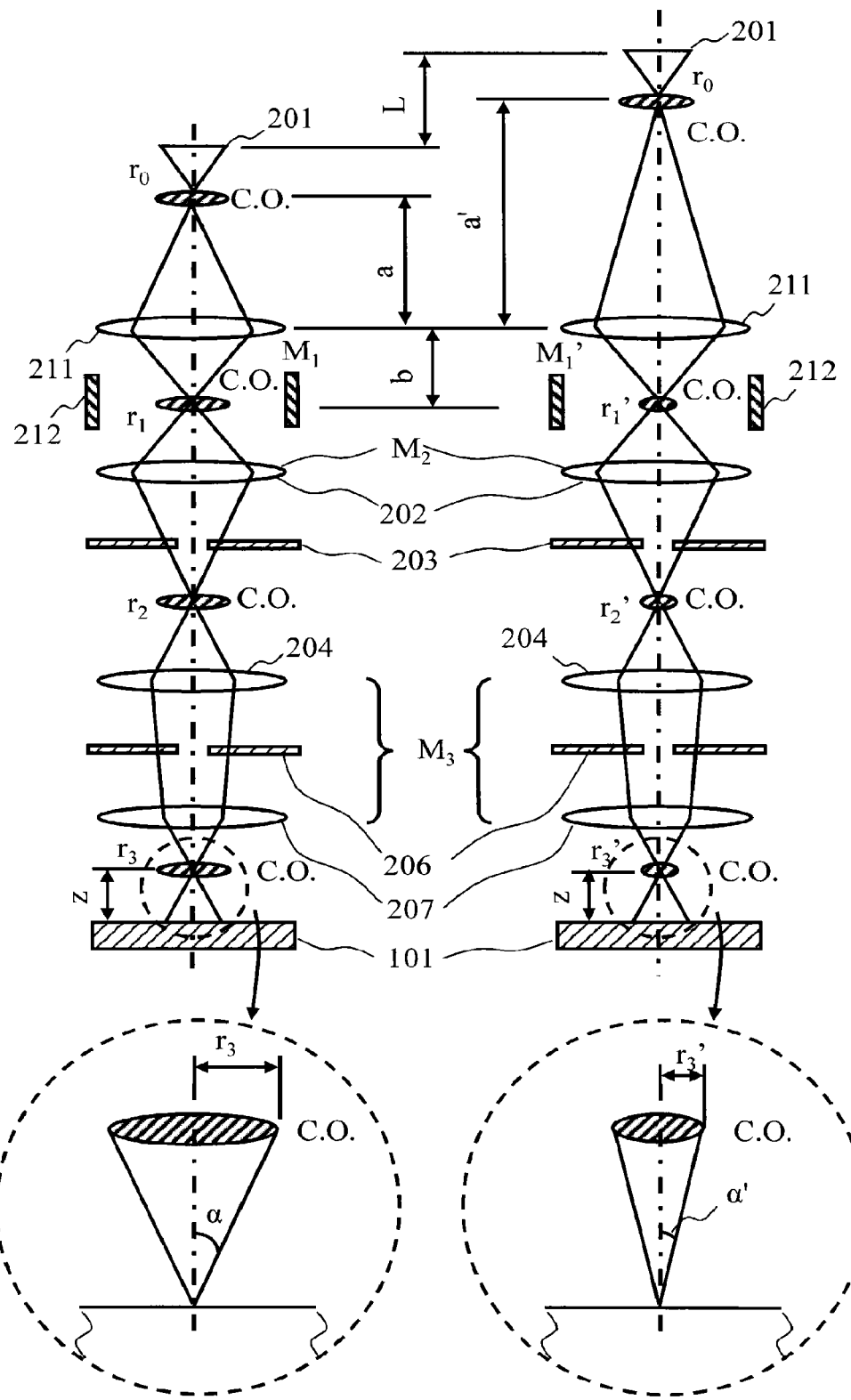
FIGS. 10A and 10B each illustrate an optical trajectory and a convergence half angle in the crossover system according to the second embodiment.

FIGS. 10A and 10B each illustrate an optical trajectory and a convergence half angle in the crossover system according to the second embodiment. FIG. 10A shows an optical trajectory in the crossover system in a writing mode 1 (first writing mode) which puts emphasis on throughput. FIG. 10B shows an optical trajectory in the crossover system in a writing mode 2 (second writing mode) which puts emphasis on resolution. The height position of the electron gun 201 is different between the writing mode 1 of FIG. 10A and the writing mode 2 of FIG. 10B. Illustration of the current-limiting aperture member 220 is omitted in FIGS. 10A and 10B. Except for the arrangement (positional relation) of the current-limiting aperture member 220, the arrangement (positional relation) of the other structure elements is the same in FIGS. 10A and 10B. FIGS. 10A and 10B each show the state of "beam on" in blanking control.

In FIG. 10A, after a cathode crossover (C.O. radius $r_0$) is formed by the electron gun 201 (emission unit), the electron beam 200 advances into the electron optical column 102, and is converged at the central height position in the blanking deflector 212 by the electron lens 211 so as to form the first crossover (C.O. radius $r_1$). After the first crossover is formed, the electron beam 200 is converged at the height position of after passing the first shaping aperture member 203 by the illumination lens 202, and forms the second crossover (C.O. radius $r_2$). After the second crossover is formed, the electron beam 200 is reduced by the reduction optical system composed of the projection lens 204 and the objective lens 207, and converged at the height position (position of height z from the surface of the target object 101) between the objective lens 207 and the surface of the target object 101 so as to form the third crossover (C.O. radius $r_3$). Then, after the third crossover is formed, the electron beam 200 irradiates the surface of the target object 101. In such a case, the crossover radius in each crossover can be defined as described below.

The crossover radius $r_1$ in the first crossover can be defined by the following equation (5) using a convergence magnification M1 by the electron lens 211.

$$r_1 = r_0 \cdot M1 \quad (5)$$

The magnification M1 can be defined by the following equation (6) using the distance "a" between the cathode crossover position and the height position of the center of the magnetic field of the electron lens 211, and the distance "b" between the height position of the center of the magnetic field of the electron lens 211 and the first crossover height position.

$$M1 = b/a \quad (6)$$

The crossover radius $r_2$ in the second crossover can be defined as $r_2 = r_1 \cdot M2$ using a convergence magnification M2 by the illumination lens 202. Similarly, the crossover radius $r_3$ in the third crossover can be defined as $r_3 = r_2 \cdot M3$ using a convergence magnification M3 by the reduction optical system composed of the projection lens 204 and the objective lens 207. Therefore, the crossover radius $r_3$ in the third crossover which is closest to the surface of the target object 101 can be defined by the following equation (7).

$$r_3 = r_0 \cdot M1 \cdot M2 \cdot M3 = r_0 \cdot (b/a) \cdot M2 \cdot M3 \quad (7)$$

Therefore, an angle (convergence half angle) α viewed from the point where the optical axis intersects the surface of the target object 101 toward the edge of the third crossover closest to the surface of the target object 101, that is, in other words, the angle (convergence half angle) α between the optical axis line and the line connecting the point where the optical axis intersects the surface of the target object 101 and the edge of the third crossover which is closest to the surface of the target object 101 can be defined by the following equation (8).

$$\alpha = \tan^{-1}(r_3/z) \quad (8)$$

Then, as to resolution, resolution depends upon electron optical aberration, and electron optical aberration is proportional to the power (exponentiation) of the convergence half angle α. As shown in the equation (8), the convergence half angle α depends upon the crossover radius $r_3$ of an electron beam. Therefore, in terms of attaching weight to resolution, it is important to decrease a crossover radius in order to reduce a convergence half angle. Therefore, what is necessary is to increase the distance "a" against the distance "b", based on the equation (7).

Then, according to the second embodiment, the height position of the electron gun mechanism 230 is variably adjusted by the height adjustment mechanism 216. In the writing mode 2 putting emphasis on resolution, as shown in FIG. 10B, the height position of the electron gun 201 is adjusted by the height adjustment mechanism 216 to be higher by a length L than the height position of the electron gun 201 in the writing mode 1 shown in FIG. 10A. Note, however, that according to the second embodiment, respective corresponding height positions of the first, second, and third crossovers are adjusted to be the same between FIGS. 10A and 10B in order not to change the other optical conditions. Specifically, for each variably adjusted and changed height position of the electron gun mechanism 230, the lens control circuit 130 (lens control unit) controls the electron lens 211 such that the electron beam forms a crossover at the central height position of the blanking deflector 212. Thereby, lens adjustment after the electron lens 211 can be performed in the same conditions.

In FIG. 10B, after a cathode crossover (C.O. radius $r_0$) is formed by the electron gun 201 (emission unit), the electron beam 200 advances into the electron optical column 102, and is converged at the central height position in the blanking deflector 212 by the electron lens 211 so as to form the first crossover (C.O. radius $r_1'$). After the first crossover is formed, the electron beam 200 is converged at the height position of after passing the first shaping aperture member 203 by the illumination lens 202, and forms the second crossover (C.O. radius $r_2'$). After the second crossover is formed, the electron beam 200 is reduced by the reduction optical system composed of the projection lens 204 and the objective lens 207, and converged at the height position (position of height z from the surface of the target object 101) between the objective lens 207 and the surface of the target object 101 so as to form the third crossover (C.O. radius $r_3'$). Then, after the third crossover is formed, the electron beam 200 irradiates the surface of the target object 101. In such a case, the crossover radius in each crossover can be defined as described below.

The crossover radius $r_1'$ in the first crossover can be defined by the following equation (9) using a convergence magnification M1' by the electron lens 211.

$$r_1' = r_0 \cdot M1' \quad (9)$$

The magnification M1' can be defined by the following equation (10) using the distance "a'" between the cathode crossover position and the height position of the center of the magnetic field of the electron lens 211, and the distance "b" between the height position of the center of the magnetic field of the electron lens 211 and the first crossover height position.

$$M1' = b/a' \quad (10)$$

The crossover radius $r_2'$ in the second crossover can be defined as $r_2' = r_1' \cdot M2$ using a convergence magnification M2 by the illumination lens 202. Similarly, the crossover radius $r_3'$ in the third crossover can be defined as $r_3' = r_2' \cdot M3$ using a convergence magnification M3 by the reduction optical system composed of the projection lens 204 and the objective lens 207. Therefore, the crossover radius $r_3'$ in the third crossover which is closest to the surface of the target object 101 can be defined by the following equation (11).

$$r_3' = r_0 \cdot M1' \cdot M2 \cdot M3 = r_0 \cdot (b/a') \cdot M2 \cdot M3 \quad (11)$$

Therefore, an angle (convergence half angle) α' viewed from the point where the optical axis intersects the surface of the target object 101 toward the edge of the third crossover closest to the surface of the target object 101, that is, in other words, the angle (convergence half angle) α between the optical axis line and the line connecting the point where the optical axis intersects the surface of the target object 101 and the edge of the third crossover which is closest to the surface of the target object 101 can be defined by the following equation (12).

$$\alpha' = \tan^{-1}(r_3'/z) \quad (12)$$

Therefore, by defining that distance a<distance a', it becomes convergence half angle α'<convergence half angle α, and thus, by heightening the height position of the electron gun 201, the convergence half angle can be reduced. Consequently, it is possible to reduce electron optical aberration and increase resolution.

Figures 11A, 11B:
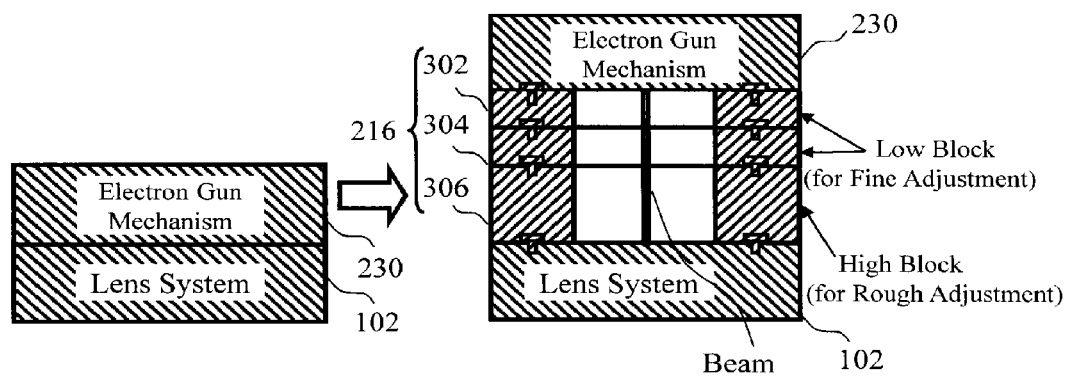
FIGS. 11A and 11B show an example of the structure of a height adjustment mechanism according to the second embodiment.

FIGS. 11A and 11B show an example of the structure of a height adjustment mechanism according to the second embodiment. As shown in FIGS. 11A and 11B, the height adjustment mechanism 216 includes a plurality of spacer members 302, 304, and 306. At the center of each of a plurality of spacer members 302, 304, and 306, an opening for letting an electron beam pass through is formed. It is preferable for the size of the outer diameter of the space members 302, 304, and 306 to be in accordance with the outer diameter of the electron optical column 102. Moreover, airtightness is ensured (sealed) by, for example, O-rings, etc. (not shown) between each of a plurality of spacer members 302, 304, and 306, between the spacer member 302 and the electron gun mechanism 230, and between the spacer member 306 and the electron optical column 102. For example, in the writing mode 1, as shown in FIG. 11A, the electron gun mechanism 230 and the electron optical column 102 are directly connected. Alternatively, the electron gun mechanism 230 and the electron optical column 102 are connected interleaving one of a plurality of spacer members 302, 304, and 306. In the writing mode 2, as shown in FIG. 11B, the electron gun mechanism 230 and the electron optical column 102 are connected interleaving a plurality of spacer members 302, 304, and 306. The thicknesses in the height direction of a plurality of spacer members, such as the spacer members 302 and 306, are different from each other. The height adjustment mechanism 216 roughly adjusts the height position of the electron gun mechanism 230 by using the spacer 306 having a larger thickness in the height direction, and finely adjusts it by using the spacers 302 and 304 each having a smaller thickness in the height direction, for example. However, the structure of the height adjustment mechanism 216 is not limited thereto.

Figures 12A, 12B:
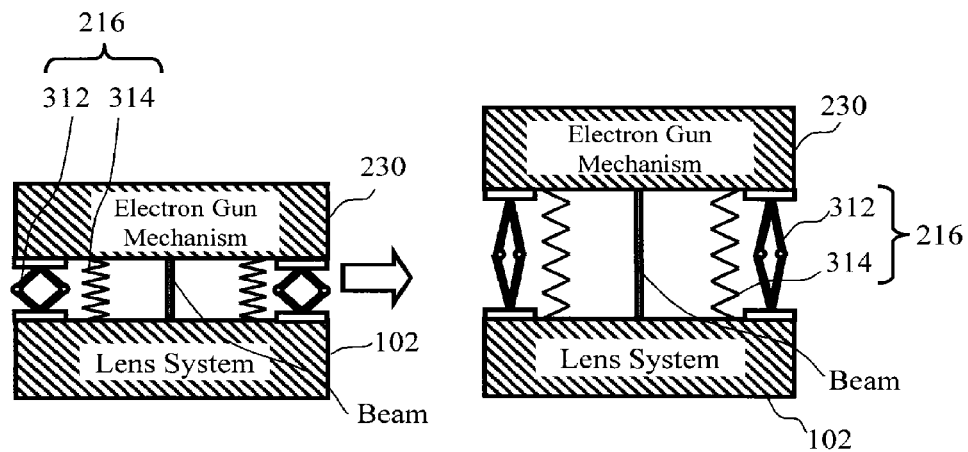
FIGS. 12A and 12B show another example of the height adjustment mechanism according to the second embodiment.

FIGS. 12A and 12B show another example of the height adjustment mechanism according to the second embodiment. As shown in FIGS. 12A and 12B, the height adjustment mechanism 216 includes an elastic piping 314 and an elevating mechanism 312 for elevating the electron gun mechanism 230. Bellows piping etc. is suitable as the piping 314. By connecting the electron gun mechanism 230 and the electron optical column 102 by using the piping 314, the airtightness can be maintained in the electron gun mechanism 230 and the electron optical column 102, thereby maintaining a vacuum state. For example, three elevating mechanisms 312 are arranged at the external side of the piping 314, and support the electron gun mechanism 230 at three points. In the writing mode 1, as shown in FIG. 12A, the height position of the electron gun mechanism 230 is in the state lowered by the elevating mechanism 312, and in the writing mode 2, as shown in FIG. 12B, the height position of the electron gun mechanism 230 is in the state raised by the elevating mechanism 312.

The writing method according to the second embodiment executes a mode selection (setting) step, a height adjustment step for electron gun mechanism, a height adjustment step for a current-limiting aperture member, a crossover height adjustment step, a mode switching (setting) step, a height adjustment step for electron gun mechanism, a height adjustment step for a current-limiting aperture member, and a crossover height adjustment step. The height adjustment step for a current-limiting aperture member will be explained after description of other steps.

In the mode selection step, one of the writing mode 1 putting emphasis on throughput and the writing mode 2 putting emphasis on resolution is selected. Here, the writing mode 1 is selected, for example.

In the height adjustment step for electron gun mechanism, when the writing mode 1 is selected, the height adjustment mechanism 216 adjusts the height position of the electron gun mechanism 230, which emits the electron beams 200, to be a height position $Z_0$ (first position). For example, the height position of the bottom surface of the electron gun mechanism 230 is adjusted to be the height position $Z_0$.

In the crossover height adjustment step, when the writing mode 1 is selected, the lens control circuit 130 adjusts, by using the electron lens 211, the crossover height position of the electron beam 200 which was emitted from the electron gun mechanism 230 and has passed through the electron lens 211 to be a central height position (second position) in the blanking deflector 212.

In the state described above, writing is performed, for example, on a product mask with respect to which throughput is emphasized. Then, the writing mode is switched in order to perform writing, for example, on an evaluation mask for development with respect to which resolution is emphasized.

In the mode switching step, switching is performed between the writing mode 1 putting emphasis on throughput and the writing mode 2 putting emphasis on resolution. Here, the writing mode 1 is switched to the writing mode 2, for example.

In the height adjustment step for electron gun mechanism, when the writing mode 1 is switched to the writing mode 2 to be selected, the height adjustment mechanism 216 adjusts the height position of the electron gun mechanism 230 to be a height position $Z_1'$ (third position) higher than the height position $Z_0'$ with respect to the direction of the optical axis. For example, the height position of the bottom surface of the electron gun mechanism 230 is adjusted to be the height position $Z_1'$. Expressed in another way, the height position of the electron gun mechanism 230 which emits electron beams is changed to the height position $Z_1'$ from the height position $Z_0'$.

In the crossover height adjustment step, when the writing mode 2 is selected, the lens control circuit 130 makes an adjustment, by using the electron lens 211, to maintain the crossover height position of the electron beam 200 which was emitted from the electron gun mechanism 230 and has passed through the electron lens 211 to be the central height position (second position) in the blanking deflector 212. Expressed in another way, the crossover height position of the electron beam 200 which was emitted from the electron gun mechanism 230 and has passed through the electron lens 211 is adjusted to be the crossover height position of the electron beam 200 of before changing the height position of the electron gun mechanism 230.

When performing switching from the writing mode 2 to the writing mode 1, the height position of the electron gun mechanism in the writing mode 2 is adjusted to the height position of the electron gun mechanism in the writing mode 1. Then, the crossover height position of the electron beam 200 having passed through the electron lens 211 should be adjusted to maintain the central height position (second position) in the blanking deflector 212.

Figures 13A, 13B, 13C:
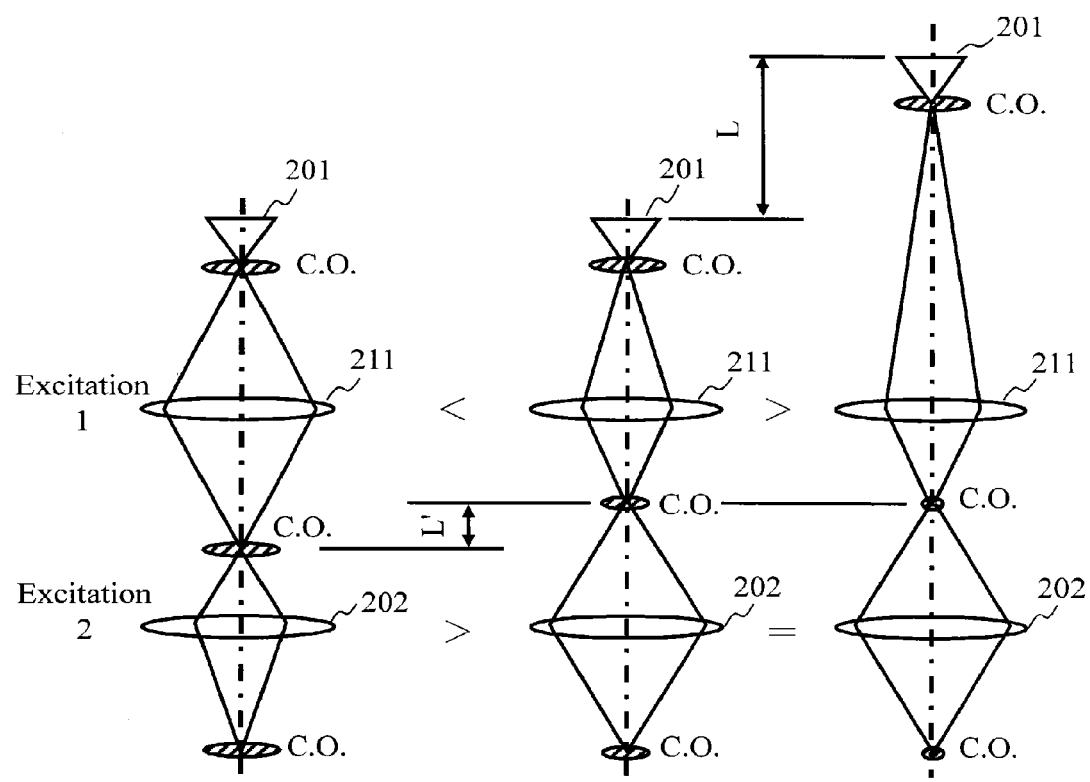
FIGS. 13A to 13C each show an example of the relationship between a crossover radius and excitation of an electron lens according to the second embodiment.

FIGS. 13A to 13C each show an example of the relationship between a crossover radius and excitation of an electron lens according to the second embodiment. FIG. 13A shows an example of the state where excitation of the electron lens 211 can be increased. In FIG. 13A, after a cathode crossover is formed by the electron gun 201, the electron beam 200 advances into the electron optical column 201, and is converged at a certain height position so as to form the first crossover. After the first crossover is formed, the electron beam 200 is converged at a certain height position by the illumination lens 202, and forms the second crossover. At this stage, in order to reduce the convergence half angle, it is necessary to increase the excitation (excitation 1) of the electron lens 211 as much as possible. Therefore, the excitation (excitation 1) of the electron lens 211 is increased as much as possible. In that case, as shown in FIG. 13B, since the excitation has been increased, the first crossover position after passing through the electron lens 211 moves to be higher by a height L' with respect to the height direction. Therefore, the first crossover radius can be smaller than that of FIG. 13A, and furthermore, the crossover radiuses of the second and subsequent crossovers can be made smaller than those of FIG. 13A. As a result, the convergence half angle can be made smaller than that of FIG. 13A. When not changing the height position of the second crossover, the excitation (excitation 2) of the illumination lens 202 can be reduced by the operation described above.

However, there is a limit to increase a magnetic flux density due to magnetic saturation, etc. of pole piece material used for the electron lens 211. Therefore, there is also a limit to increase excitation of the electron lens 211, depending on the limit of magnetic flux density. Accordingly, there is also a limit to focus an electron beam by controlling an illumination lens, and thus, also a limit to reduce a convergence half angle.

On the other hand, according to the second embodiment, the height position of the electron gun 201 is set to be higher than that of FIG. 13B by the height L. This operation makes it possible to reduce the excitation (excitation 1) of the electron lens 211 when not changing the first crossover position, as shown in FIG. 13C. Therefore, the first crossover radius can be made smaller than that of FIG. 13B, and furthermore, the crossover radiuses of the second and subsequent crossovers can be made smaller than those of FIG. 13B. As a result, the convergence half angle can be made smaller than that of FIG. 13B. Moreover, this operation makes it possible to maintain the excitation (excitation 2) of the illumination lens 202 to be the same state (lowered state) as that of FIG. 13B when not changing the height position of the second crossover. Therefore, according to the second embodiment, it is possible to reduce the convergence half angle to be smaller than the limiting point because of magnetic saturation, etc.

Next, the reason for setting the first crossover position to be the central height position of the blanking deflector 212 is described below.

If the DAC amplifier 122 for blanking control is unstable, voltage may change when the beam is on. For example, a voltage change of several mV (e.g., ±5 mV), or a larger voltage change may occur. The electron beam 200 passing through the blanking deflector 212 is deflected by such change.

Figures 14A, 14B:
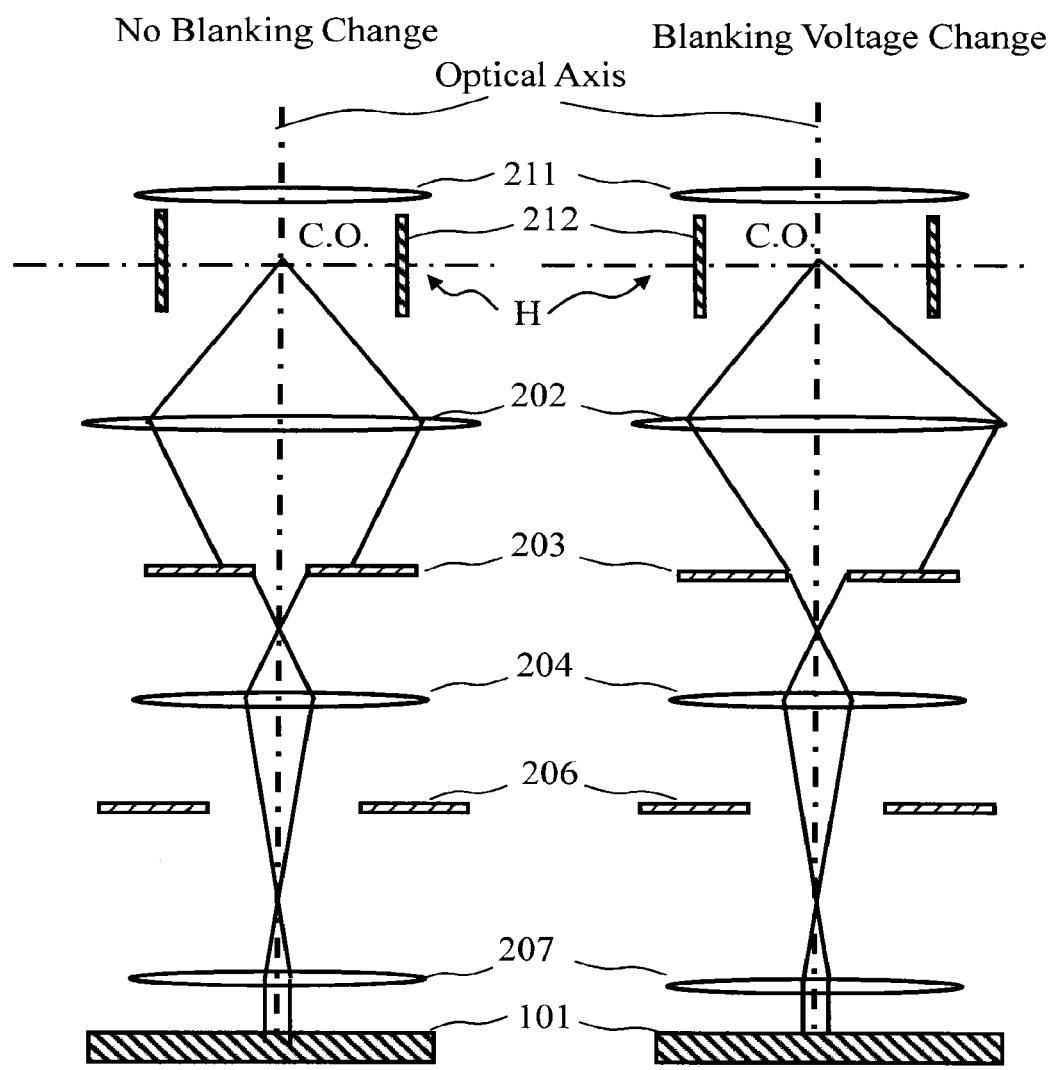
FIGS. 14A and 14B are conceptual diagrams showing comparison between a blanking voltage change and no blanking voltage change when a crossover position has been controlled to be the center height position of the blanking deflector according to the second embodiment.

FIGS. 14A and 14B are conceptual diagrams showing comparison between a blanking voltage change and no blanking voltage change when a crossover position has been controlled to be the center height position of the blanking deflector according to the second embodiment. FIG. 14A shows the case where a blanking voltage (e.g., 0V) in the "beam on" state is applied to the blanking deflector 212 and no voltage change (or a change of an ignorable extent) occurs in the blanking voltage. Moreover, FIG. 14A shows the case where beam deflection other than a blanking operation is not performed by the shaping deflector 205, the sub deflector 209, and the main deflector 208, and the beam passes along the optical axis, for example. In FIG. 14A, the electron beam 200 emitted from the electron gun 201 (emission unit) is controlled by the electron lens 211 to form a convergence point (crossover: C.O.) at the center height position H in the blanking deflector 212. Since it is in the "beam on" state in this case, the electron beam 200 passes without being deflected by the blanking deflector 212. FIG. 14A shows an optical path of the crossover system. The electron beam having passed through the blanking deflector 212 illuminates the whole of the first shaping aperture member 203 by the illumination lens 202. Then, the electron beam 200 of the first aperture image having passed through the first shaping aperture member 203 is projected by the projection lens 204 toward the opening formed in the second shaping aperture plate 206. Then, the electron beam 200 of the second aperture image having passed through the second shaping aperture plate 206 is focused to form an image on the surface of the target object 101 by the objective lens 207. In this configuration, the electron beam 200 perpendicularly enters the surface of the target object 101. In other words, the beam incident angle θ is 0°.

FIG. 14B shows the state, changed from the state of FIG. 14A, where a voltage change in the extent not to trigger a "beam off" state occurs in the blanking voltage to be applied to the blanking deflector 212. As shown in FIG. 14B, the beam is deflected at the center height position H of the blanking deflector 212 by a change of the blanking voltage. However, when the crossover position is controlled to be the center height position of the blanking deflector 212, even if a blanking voltage change occurs, the electron beam 200 enters the surface of the target object 101 at an angle substantially equivalent to a perpendicular incidence. In other words, the beam incident angle θ can be approximately 0°. In this configuration, since the crossover position does not deviate from the optical axis as to be described later, the electron beam 200 can perpendicularly enter the surface of the target object 101.

Figures 15A, 15B:
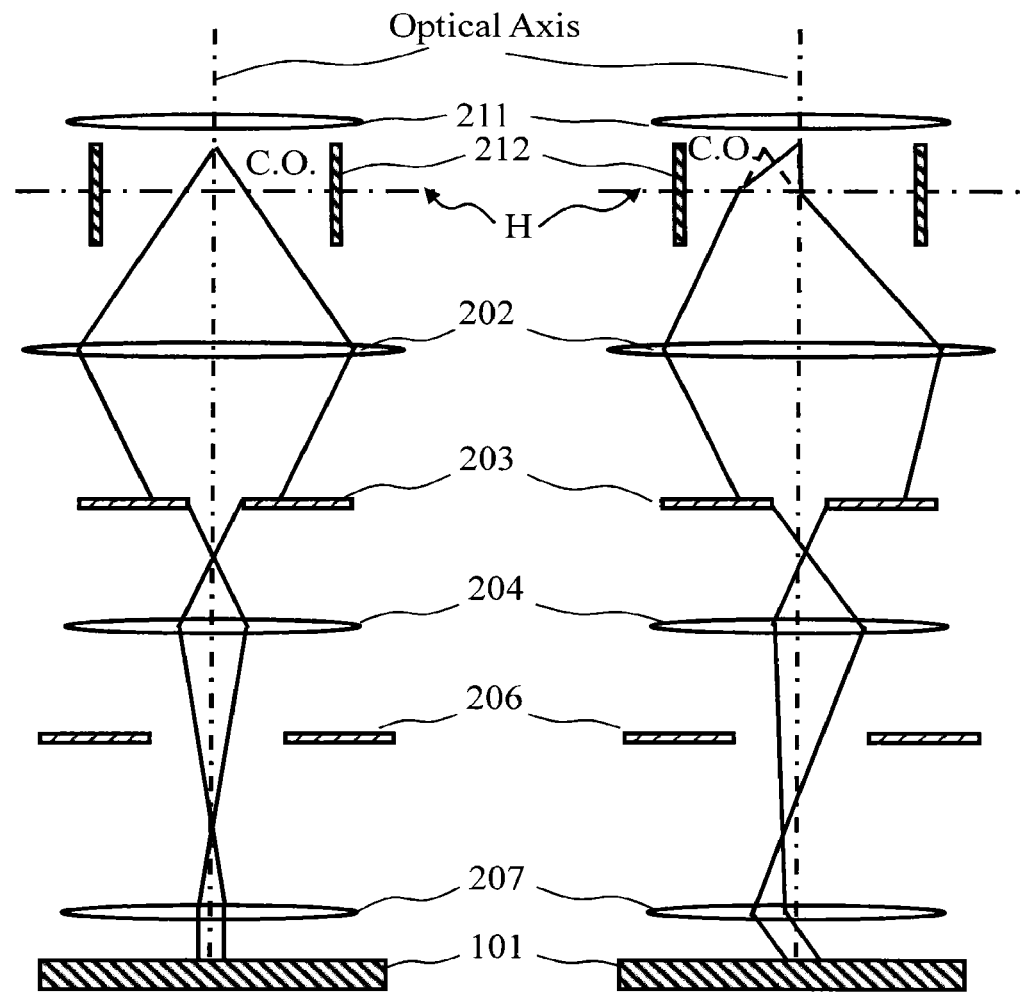
FIGS. 15A and 15B are conceptual diagrams showing comparison between a blanking voltage change and no blanking voltage change when a crossover position has been controlled to be deviated from the center height position of the blanking deflector according to the second embodiment.

FIGS. 15A and 15B are conceptual diagrams showing comparison between a blanking voltage change and no blanking voltage change when a crossover position has been controlled to be deviated from the center height position of the blanking deflector according to the second embodiment. FIG. 15A shows the case where a blanking voltage (e.g., 0V) in the "beam on" state is applied to the blanking deflector 212 and no voltage change (or a change of an ignorable extent) occurs in the blanking voltage. Moreover, FIG. 15A shows the case where beam deflection other than a blanking operation is not performed by the shaping deflector 205, the sub deflector 209, and the main deflector 208, and the beam passes along the optical axis, for example. In FIG. 15A, the electron beam 200 emitted from the electron gun 201 (emission unit) is adjusted by the electron lens 211 to form a convergence point (crossover: C.O.) at a position higher than the center height position H of the blanking deflector 212, for example. Since it is in the "beam on" state in this case, the electron beam 200 passes without being deflected by the blanking deflector 212. FIG. 15A shows an optical path of the crossover system. The electron beam having passed through the blanking deflector 212 illuminates the whole of the first shaping aperture member 203 by the illumination lens 202. Then, the electron beam 200 of the first aperture image having passed through the first shaping aperture member 203 is projected by the projection lens 204 toward the opening formed in the second shaping aperture plate 206. Then, the electron beam 200 of the second aperture image having passed through the second shaping aperture plate 206 is focused to form an image on the surface of the target object 101 by the objective lens 207. In this state, since the crossover position does not deviate from the optical axis as described later, the electron beam 200 perpendicularly enters the surface of the target object 101. In other words, the beam incident angle θ is 0°.

FIG. 15B shows the state, changed from the state of FIG. 15A, where a voltage change in the extent not to trigger a "beam off" state occurs in the blanking voltage to be applied to the blanking deflector 212. As shown in FIG. 15B, the beam is deflected at the center height position H of the blanking deflector 212 by a change of the blanking voltage. However, when the crossover position is controlled to be higher than the center height position H of the blanking deflector 212, if a blanking voltage change occurs, the electron beam 200 enters the surface of the target object 101 from a direction displaced from the perpendicular direction. In other words, the beam incident angle θ is not 0°. As a result, the beam irradiation position on the target object 101 deviates from a designed desired position when in the defocused state. It means that, in FIG. 15B, the crossover position has apparently moved to the position illustrated by the broken line in the blanking deflector 212 from the position on the optical axis, from the view point of the beam after deflection, as described later.

Figure 16A:
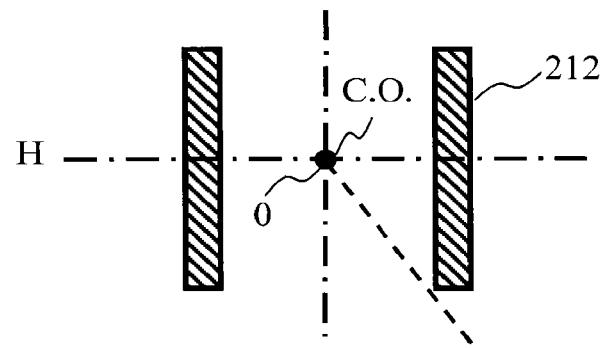
FIGS. 16A to 16D show the relationship between a deflection fulcrum position and a crossover position at the time of blanking operation according to the second embodiment.
Figure 16B:
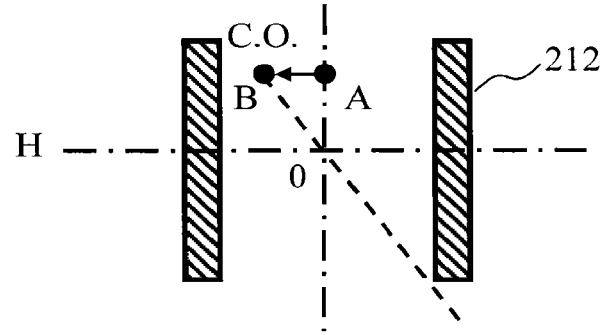
Figure 16C:
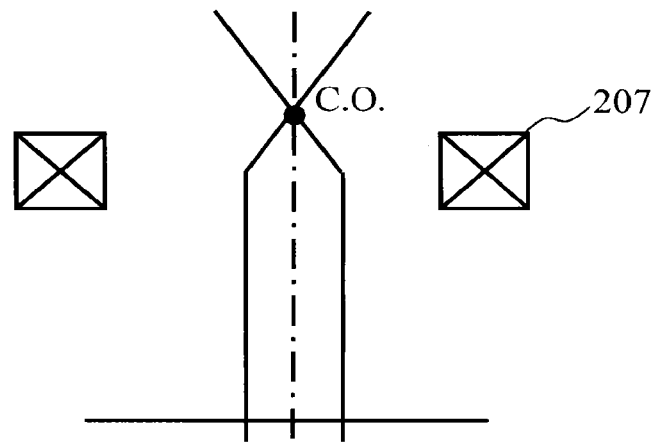
Figure 16D:
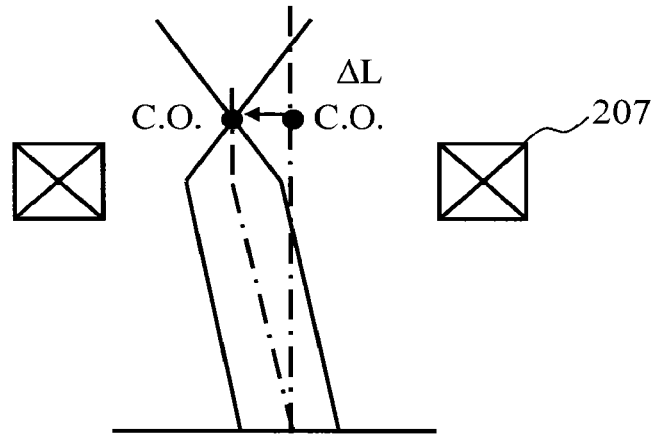

FIGS. 16A to 16D show the relationship between a deflection fulcrum position and a crossover position at the time of blanking operation according to the second embodiment. FIG. 16A shows the case where adjustment has been made to form a convergence point (crossover: C.O.) at the center height position H of the blanking deflector 212 by the electron lens 211. When a voltage is applied to the blanking deflector 212 and the electron beam 200 is deflected, the deflection fulcrum is the center height position H of the blanking deflector 212. When the crossover position is located at the center height position H of the blanking deflector 212, since the deflection fulcrum and the position are coincident with each other, the crossover position is located on the optical axis. Therefore, as shown in FIG. 16C, the final crossover position is also formed on the optical axis. On the other hand, as shown in FIG. 16B, when the crossover position deviates from the center height position H of the blanking deflector 212, the crossover position and the deflection fulcrum position are not coincident with each other as shown in FIG. 16B. Since the deflection fulcrum is located at the center height position H of the blanking deflector 212 as described above, the crossover position is apparently on the extended line of the line connecting the beam trajectory after deflection and the deflection fulcrum, from the view point of the beam after deflection. Therefore, it turns out that the crossover position has moved to the point B from the point A on the optical axis. Expressed in another way, the crossover position is formed at a position displaced from the optical axis. As shown in FIG. 16D, the final crossover position of the beam is located at the position displaced from the optical axis by ΔL. Therefore, the beam deflected by the blanking voltage change enters the target object 101 at a beam incident angle θ which is not a perpendicular incidence (θ=0). As a result, when the focus position is displaced (when defocused), the center position of an irradiating beam deviates from a designed desired position. On the other hand, in the state where there is no blanking voltage change as shown in FIG. 15A, since the deflection fulcrum is not formed in the blanking deflector 212 in the first place, the crossover position is located on the optical axis. Therefore, in such a case, the beam enters the target object 101 at a perpendicular incidence (θ=0). In the example described above, the crossover position deviates higher from the center height position H of the blanking deflector 212. However, even when it deviates downward, the same effect that the final crossover position of the beam is displaced from the optical axis can also be obtained.

Then, according to the second embodiment, in order to adjust a beam incident angle, the electron lens 211 is adjusted so that a crossover position may be located at the center height position of the blanking deflector 212.

Thus, according to the second embodiment, it is possible to improve the resolution to be higher than the conventional one. Furthermore, it is possible to perform writing processing putting emphasis on throughput and writing processing putting emphasis on resolution.

However, when the apparatus setting condition (apparatus setting mode) for setting the height position of the electron gun 201 is switched as in the second embodiment, the path length L of the electron beam 200 from the electron gun 201 to the first shaping aperture member 203 changes. If the height position of the electron gun 201 is made high, so-called chromatic aberration becomes worse due to energy dispersion ΔE increase by the longitudinal Boersch effect. Therefore, the states (amounts) of chromatic aberration become different between the writing mode 1 (apparatus setting mode) in which the height of the electron gun 201 is relatively low and the writing mode 2 (apparatus setting mode) in which the height of the electron gun 201 is relatively high. This results in that the resolution degrades because the states of chromatic aberration of electron beams illuminating the first shaping aperture member 203 arranged at the downstream side become different and shaped beams are affected by such chromatic aberration, which is the same as the problem of the first embodiment. Therefore, it is required that chromatic aberration does not change between the writing mode 1 in which the height of the electron gun 201 is relatively low and the writing mode 2 in which the height of the electron gun 201 is relatively high when the writing apparatus 100 is operated with switching both the modes.

Figures 17A, 17B:
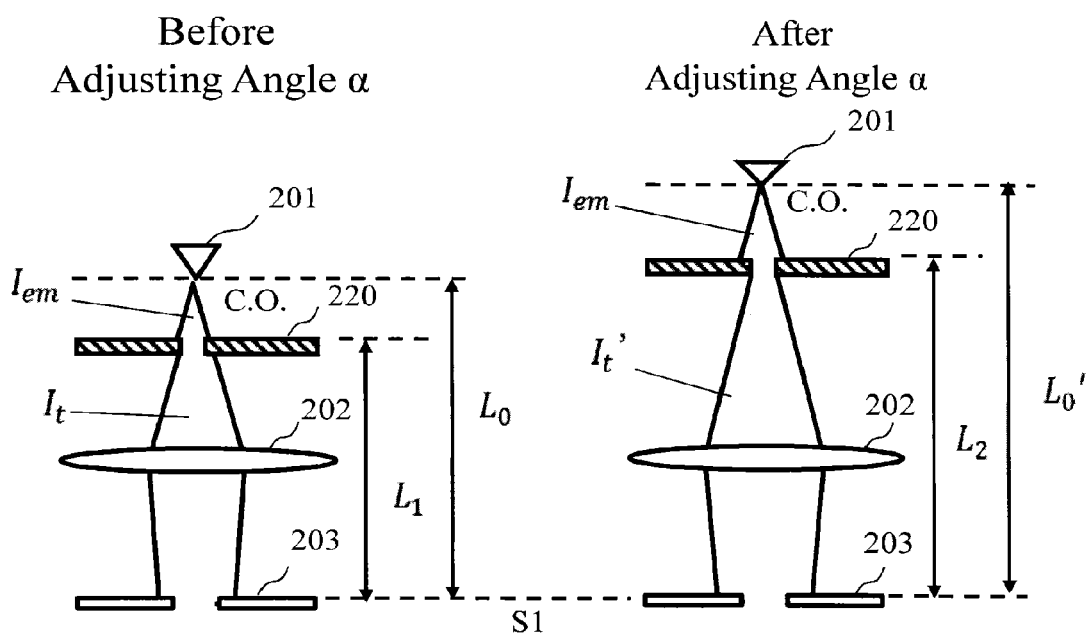
FIGS. 17A and 17B show examples of positional relationship of each structure from the electron gun to the shaping aperture member in each apparatus setting mode according to the second embodiment.

FIGS. 17A and 17B show examples of positional relationship of each structure from the electron gun to the shaping aperture member in each apparatus setting mode according to the second embodiment. FIG. 17A shows an example of positional relationship of the electron gun 201, the current-limiting aperture member 220, the illumination optical system 232, and the first shaping aperture member 203 in the writing mode 1 where the height of the electron gun 201 is relatively low. FIG. 17B shows an example of positional relationship of the electron gun 201, the current-limiting aperture member 220, the illumination optical system 232, and the first shaping aperture member 203 in the writing mode 2 where the height of the electron gun 201 is relatively high. As shown in FIGS. 17A and 17B, the height position of the current-limiting aperture member 220 in the writing mode 2 where the height of the electron gun 201 is relatively high is adjusted to be higher than that of the writing mode 1. The way of adjustment will be described below.

In FIG. 17A, the ratio between the emission current $I_{em}$ emitted from the electron gun 201 and the emission current $I_t$ after having been current-limited by the current-limiting aperture member 220 in the writing mode 1, where the height of the electron gun 201 is relatively low, is the same as that of the equation (2) described above.

On the other hand, in FIG. 17B, the ratio between the emission current $I_{em}$ emitted from the electron gun 201 and the emission current $I_t'$ after having been current-limited by the current-limiting aperture member 220 in the writing mode 2, where the height of the electron gun 201 is relatively high, can be defined by the following equation (13).

$$I_t'/I_{em} = \{r/(\alpha_1(L_0' - L_2))\}^2 \quad (13)$$

In the equation (13), unlike the first embodiment, the distance from the electron gun 201 (crossover formation position in the electron gun 201) to the surface (top side) of the first shaping aperture member 203 changes (becomes long) from $L_0$ to $L_0'$ instead of changing of the emission current.

Therefore, when making the energy dispersion ΔE at the surface (top side) of the first shaping aperture member 203 the same between the writing mode 1 and the writing mode 2, the following equation (14) can be satisfied.

$$\Delta E_{em}(L_0 - L_1, I_{em})^2 + \Delta E_t(L_1, I_t)^2 = \Delta E_{em}(L_0' - L_2, I_{em})^2 + \Delta E_t(L_2, I_t')^2 \quad (14)$$

As shown in the equation (1), the energy dispersion ΔE depends on the path length L, the current amount I, and the emission half angle α. Since the emission half angle α is the same, $\Delta E_{em}$ in the writing mode 1 depends on $L_0 - L_1$ and $I_{em}$. $\Delta E_t$ in the writing mode 1 depends on $L_1$ and $I_t$. Similarly, $\Delta E_{em}$ in the writing mode 2 depends on $L_0' - L_2$ and $I_{em}$. $\Delta E_t$ in the writing mode 2 depends on $L_2$ and $I_t'$.

Therefore, the height position of each structure should be adjusted so that the equations (13) and (14), or the equations (2) and (14) may be satisfied. In other words, if the distances $L_0$ and $L_1$ (or $L_0'$ and $L_2$) for determining the height position of each structure, the emission current value $I_{em}$ and the current value $I_t$ (or $I_t'$) in one of the writing mode 1 and the writing mode 2, and the distance $L_0'$ (or $L_0$) in the other mode have already been specified, the distance $L_2$ (or $L_1$) for determining the height position and the current value $I_t'$ (or $I_t$) in the other mode can be specified. If, for example, the emission current value $I_{em}$ in both the modes, the distance $L_1$ from the surface (top side) of the current-limiting aperture member 220 to the surface (top side) of the first shaping aperture member 203, the distance $L_0$ from the electron gun 201 to the surface (top side) of the first shaping aperture member 203, and the current value $I_t$ which are in the writing mode 1, and the distance $L_0'$ from the electron gun 201 to the surface (top side) of the first shaping aperture member 203 in the writing mode 2 have already been specified, the distance $L_2$ from the surface (top side) of the current-limiting aperture member 220 to the surface (top side) of the first shaping aperture member 203 and the current value $I_t'$ in the writing mode 2 can be specified. Conversely, for example, if the emission current value $I_{em}$ in both the modes, the distance $L_2$ from the surface (top side) of the current-limiting aperture member 220 to the surface (top side) of the first shaping aperture member 203, the distance $L_0'$ from the electron gun 201 to the surface (top side) of the first shaping aperture member 203, and the current value $I_t'$ which are in the writing mode 2, and the distance $L_0$ from the electron gun 201 to the surface (top side) of the first shaping aperture member 203 in the writing mode 1 have already been specified, the distance $L_1$ from the surface (top side) of the current-limiting aperture member 220 to the surface (top side) of the first shaping aperture member 203 and the current value $I_t$ in the writing mode 1 can be specified. Since the energy dispersion $\Delta E$ can be specified by each optical system while depending on the path length L, the current amount I, and the emission half angle $\alpha$, values that satisfy the equations (2), (13), and (14) should be obtained by simulation or experiment for each optical system arranged in the writing apparatus 100.

Figure 18:
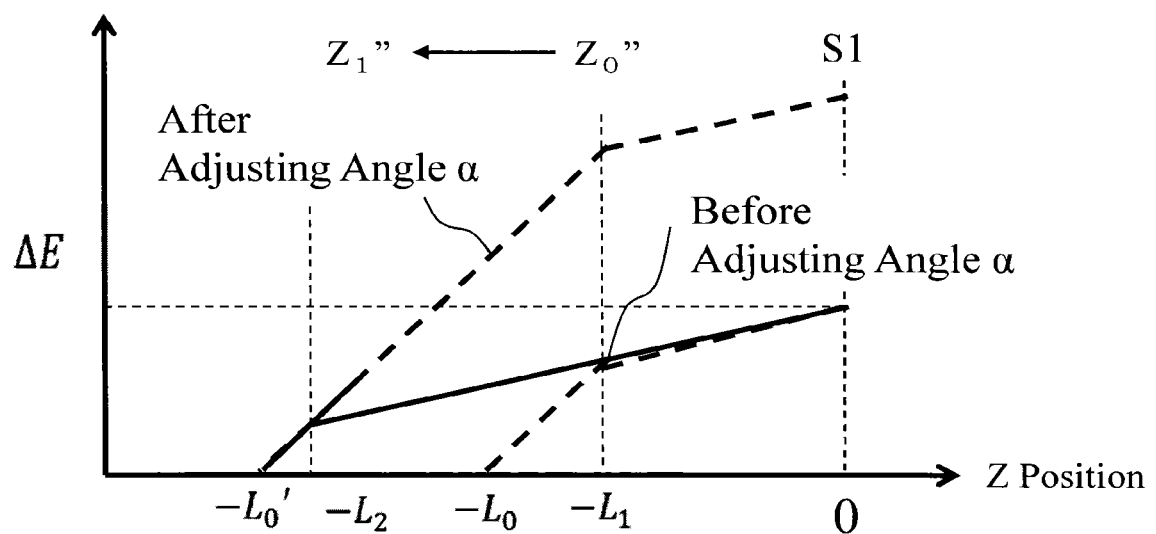
FIG. 18 shows an example of the relationship between each position from the electron gun to the shaping aperture member and energy dispersion, in each apparatus setting mode according to the second embodiment.
Figure 19:
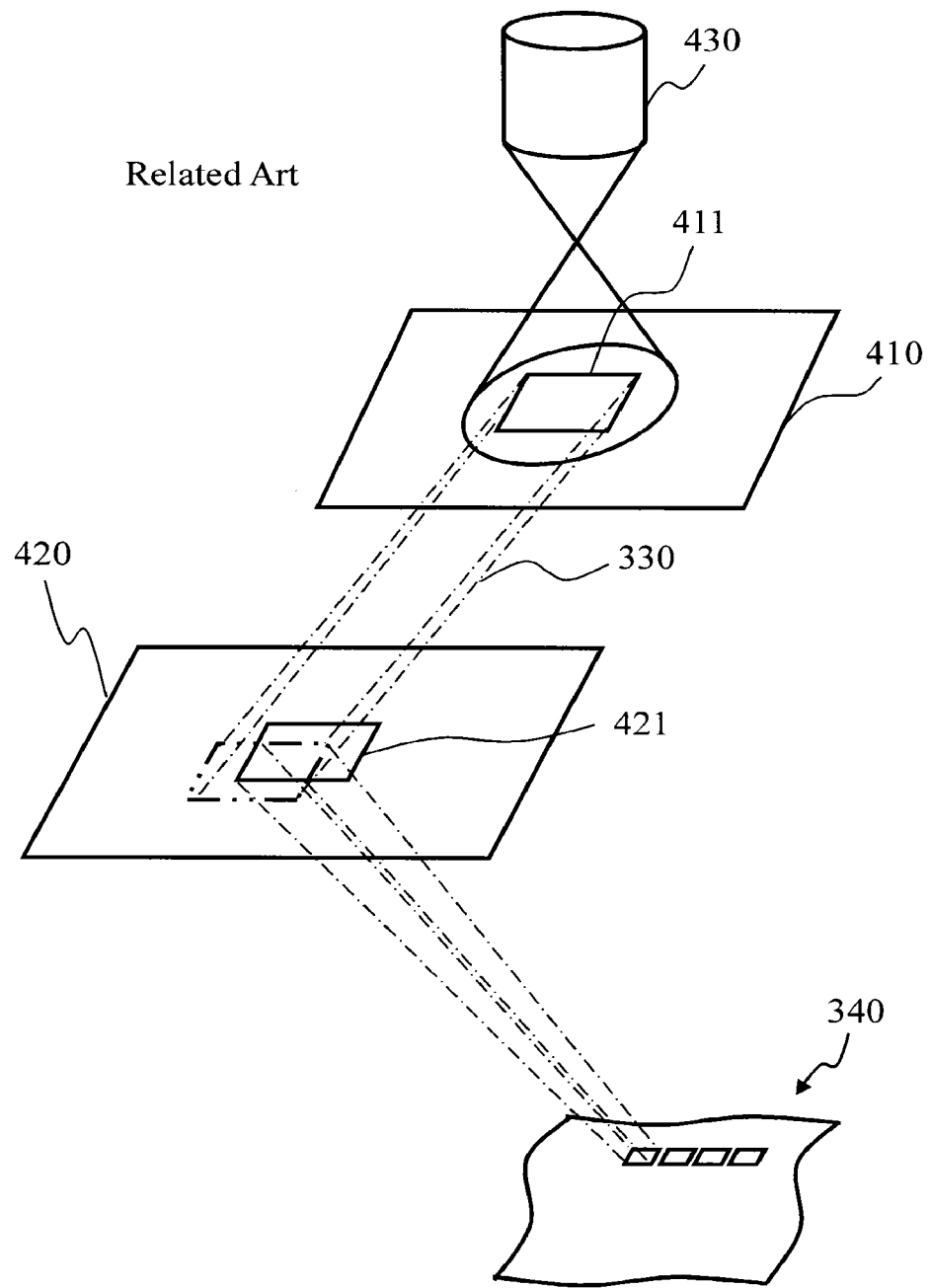
FIG. 19 is a conceptual diagram explaining operations of a variable-shaped electron beam writing apparatus.

FIG. 18 shows an example of the relationship between each position from the electron gun to the shaping aperture member and energy dispersion, in each apparatus setting mode according to the second embodiment. In the graph of FIG. 18, the ordinate axis represents energy dispersion, and the abscissa axis represents a height position (distance). In the graph of FIG. 18, the height of the surface (top side) of the first shaping aperture member 203 is defined to be "0" (zero), and the distance from the surface (top side) of the first shaping aperture member 203 to the electron gun 201 in the writing mode 1 is defined to be $-L_0$. The distance from the surface (top side) of the first shaping aperture member 203 to the electron gun 201 in the writing mode 2 is defined to be $-L_0'$. The graph of FIG. 18 shows the case where the multiplier "a" of the equation (1) is 1, and, in other words, where the energy dispersion $\Delta E$ is in linear proportion to the distance L, which is the same as FIG. 4. Dotted lines of FIG. 18 show the case where the height position of the current-limiting aperture member 220 is set to be fixed (height $Z_0''$) in the writing mode 1 and the writing mode 2. As shown by the dotted line of FIG. 18, in the range from the electron gun 201 to the current-limiting aperture member 220 (height $Z_0''$), since the emission current, etc. is the same in both the modes, the energy dispersion $\Delta E$ increases with the same gradient. However, since the electron beam is emitted from the position more away from the first shaping aperture member 203 in the writing mode 2 than the position in the writing mode 1, the energy dispersion $\Delta E$ precedingly increases in the writing mode 2 compared to the writing mode 1 by the amount corresponding to the distance of the electron gun 201 more away from the first shaping aperture member 203. Then, even after the current has been limited by the current-limiting aperture member 220 (height $Z_0''$), the energy dispersion $\Delta E$ increases while maintaining the preceding increased amount of energy dispersion $\Delta E$ in the writing mode 2 compared to the writing mode 1. Consequently, the value of the energy dispersion $\Delta E$ at the surface (top side) of the first shaping aperture member 203 is different between the writing mode 1 and the writing mode 2. Then, according to the second embodiment, the height position of the current-limiting aperture member 220 is changed to $Z_1''$ from $Z_0''$ so that the value of the energy dispersion $\Delta E$ at the surface (top side) of the first shaping aperture member 203 may be the same between the writing mode 1 and the writing mode 2. Thus, as shown by the solid line in FIG. 18, in the range from the electron gun 201 to the current-limiting aperture member 220 (height $Z_1''$), the energy dispersion $\Delta E$ increases with a gradient being the same as that before changing the height in the writing mode 2. However, at the stage where the value of the energy dispersion $\Delta E$ in the writing mode 2 is still smaller than that at the surface of the current-limiting aperture member 220 (height $Z_0''$) in the writing mode 1, the current in the writing mode 2 is limited by the current-limiting aperture member 220 (height $Z_1''$). Particularly, the height $Z_1''$ of the current-limiting aperture member 220 is adjusted in order that the value of the energy dispersion $\Delta E$ at the surface (top side) of the first shaping aperture member 203 in the writing mode 2 may be coincident with that in the writing mode 1. Thus, the value of the energy dispersion $\Delta E$ at the surface (top side) of the first shaping aperture member 203 can be the same between the writing mode 1 and the writing mode 2.

With respect to the apparatus setting mode, it is not limited to the two modes of the writing mode 1 and the writing mode 2, which is the same as the first embodiment. As in the first embodiment described above, for example, it is possible to perform switching among the first mode (condition) to the k-th mode (condition), (where k is an integer greater than or equal to 2).

As in the first embodiment, the current-limiting aperture member 220 (limiting aperture member) of the second embodiment is arranged such that its height position can be selectively adjusted according to an apparatus setting condition, with respect to the height position of the emission source, selected from a plurality (k) of apparatus setting conditions (apparatus setting modes), where k is an integer of 2 or more, $1 \leq n$, $m<k$, each of n and m is an integer of 1 or more, and $n+m \leq k$.

As described above, the current-limiting aperture member 220 is arranged such that its height position can be selectively adjusted, according to the condition, to be the n-th height position (where n is an integer greater than or equal to 1) based on the n-th condition (apparatus setting mode) for the height position of the electron gun 201 (emission source), or the (n+m)th height position (where m is an integer greater than or equal to 1), being different from the n-th height position, based on the (n+m)th condition (apparatus setting mode) for the height position of the electron gun 201 (emission source).

Therefore, the height adjustment step of the current-limiting aperture member in the writing mode 1 is performed between the height adjustment step of the electron gun mechanism and the crossover height adjustment step in the writing mode 1 described above. Moreover, the height adjustment step of the current-limiting aperture member in the writing mode 2 is performed between the height adjustment step of the electron gun mechanism and the crossover height adjustment step in the writing mode 2 described above.

In the height adjustment step of the current-limiting aperture member in the writing mode 1, based on that the n-th condition has been set, the height adjustment unit 55 adjusts the height position of the surface (top side) of the current-limiting aperture member 220 to the n-th height position. For example, the height adjustment unit 55 outputs a control signal for controlling height to the control circuit 120. Then, in the case of using the sliding mechanism of FIG. 5, the control circuit 120 slides one of a plurality of aperture members 222, 223, and 224 (e.g., the aperture member 224), which has the height concerned, such that its opening is located on the optical axis. In the case of using the elevating mechanism of FIG. 6, the height position of the aperture member 221 is moved to the height based on the control signal. In the case of FIG. 17A, it is adjusted to the height position $Z_0"$.

In the height adjustment step of the current-limiting aperture member in the writing mode 2, based on that the (n+m)th condition has been set, the height adjustment unit 55 adjusts the height position of the surface (top side) of the current-limiting aperture member 220 to the (n+m)th height position. For example, the height adjustment unit 55 outputs a control signal for controlling height to the control circuit 120. Then, in the case of using the sliding mechanism of FIG. 5, the control circuit 120 slides one of a plurality of aperture members 222, 223, and 224 (e.g., the aperture member 222), which has the height concerned, such that its opening is located on the optical axis. In the case of using the elevating mechanism of FIG. 6, the height position of the aperture member 221 is moved to the height based on the control signal. In the case of FIG. 17B, it is adjusted to the height position $Z_1"$.

Thus, according to the second embodiment, it is possible to make the value of the energy dispersion $\Delta E$ of the electron beam 200 on the first shaping aperture member 203 the same based on any apparatus setting condition (apparatus setting mode) in a plurality (k) of apparatus setting conditions (apparatus setting modes). Alternatively, it is possible to make the value closer to each other. Therefore, difference in the state of chromatic aberration of the electron beam 200 illuminating the first shaping aperture member 203 can be eliminated or reduced. Between, at least, the writing mode 1 in which the height of the electron gun 201 is relatively low and the writing mode 2 in which the height of the electron gun 201 is relatively high, it is possible to reduce the difference in the state of chromatic aberration of charged particle beams illuminating a shaping aperture for shaping beams.

Embodiments have been explained referring to specific examples described above. However, the present invention is not limited to these specific examples. Although, in the examples above, the case where a plurality of modes are switched based on one of the apparatus setting condition (apparatus setting mode) depending on the height position of the electron gun 201, and the apparatus setting condition (apparatus setting mode) depending on an emission current value has been described, it is not limited thereto. The case where a plurality of modes are switched based on an apparatus setting condition (apparatus setting mode) obtained by a combination of the apparatus setting condition (apparatus setting mode) depending on the height position of the electron gun 201, and the apparatus setting condition (apparatus setting mode) depending on an emission current value can also be applied to the present invention.

In other words, the current-limiting aperture member 220 is arranged such that its height position can be selectively adjusted, according to the apparatus setting condition (apparatus setting mode), to be the n-th height position (where n is an integer of 1 or more) based on the n-th condition depending on at least one of the height position of the electron gun 201 and an emission current value, or the (n+m)th height position (where m is an integer of 1 or more), being different from the n-th height position, based on the (n+m)th condition depending on at least one of the height position of the electron gun 201 and an emission current value.

Moreover, in the examples above, there has been described the case where it is possible not to change subsequent optical conditions by maintaining the first crossover position after passing through the electron lens 211 to the central height position of the blanking deflector 212 before and after height adjustment of the electron gun. However, it is not limited thereto. It is not necessary to limit to the apparatus in which a crossover position is located at the center of a blanking deflector. It is also preferable to change the optical conditions and the crossover position. In such a case, it is not necessary to take into account the position of a blanking deflector. As long as there is a margin for adjustment of the optical system after a crossover position, it is possible to make a convergence half angle smaller than that of the case of fixing a crossover position, by performing height adjustment of the electron gun mechanism simultaneously with increasing excitation of the electron lens 211 as shown in FIG. 6.

Moreover, in the examples above, although a variable shaped beam writing apparatus has been described, it is not limited thereto. For example, the present invention can be applied to a multi-beam writing apparatus that forms, from one electron beam, a multi-beam composed of a plurality of beams.

While the apparatus configuration, control method, and the like not directly necessary for explaining the present invention are not described, some or all of them can be selectively used case-by-case basis. For example, although description of the configuration of the control unit for controlling the writing apparatus 100 is omitted, it should be understood that some or all of the configuration of the control unit can be selected and used appropriately when necessary.

In addition, any other charged particle beam writing apparatus and charged particle beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
an emission source configured to emit a charged particle beam;
a limiting aperture member placed at a downstream side of the emission source with respect to an optical axis direction, in which a first opening is formed, and arranged such that its height position can be selectively adjusted, according to condition, to be one of an n-th height position (n being an integer greater than or equal to 1) based on an n-th condition depending on at least one of a height position of the emission source and an emission current value, and an (n+m)th height position (m being an integer greater than or equal to 1), being different from the n-th height position, based on an (n+m)th condition depending on at least one of the height position of the emission source and the emission current value;
an electron lens arranged at the downstream side of the limiting aperture member with respect to the optical axis direction, and configured to refract the charged particle beam having passed through the first opening; and
a shaping aperture member arranged at the downstream side of the electron lens with respect to the optical axis direction, in which a second opening is formed, and configured to be irradiated with the charged particle beam having been refracted by a region including a whole of the second opening, and to shape the charged particle beam by letting a part of the charged particle beam pass through the second opening, wherein a pattern is written on a target object by using at least a part of the charged particle beam having been shaped.

2. The apparatus according to claim 1, wherein the n-th height position and the (n+m)th height position are set so that energy dispersion of the charged particle beam at a surface of the shaping aperture member is same between a case where the shaping aperture member is irradiated with the charged particle beam, based on the n-th condition, in a state where the limiting aperture member has been adjusted to the n-th height position and a case where the shaping aperture member is irradiated with the charged particle beam, based on the (n+m)th condition, in a state where the limiting aperture member has been adjusted to the (n+m)th height position.

3. The apparatus according to claim 1, wherein the limiting aperture member includes multiple stages of aperture members having different height positions, and a height position of the limiting aperture member is adjusted by replacing one of the multiple stages of the aperture members to another.

4. The apparatus according to claim 1, wherein the limiting aperture member includes an elevating mechanism that can elevate the height position, and the height position of the limiting aperture member is adjusted by the elevating mechanism.

5. The apparatus according to claim 1, further comprising:
a height adjustment mechanism arranged between the emission source and the limiting aperture member whose height position can be selectively adjusted, and configured to variably adjust the height position of the emission source.

6. The apparatus according to claim 5, wherein, in a case where the height position of the emission source is set to be high based on a condition, a crossover position of the charged particle beam formed at the downstream side of the electron lens with respect to the optical axis direction is adjusted to be a same position as that in a case where the height position of the emission source is set to be low based on a condition.

7. The apparatus according to claim 6, further comprising:
another electron lens arranged between the electron lens and the shaping aperture member, and configured to refract the charged particle beam having passed through the electron lens to irradiate the region including the whole of the second opening.

8. The apparatus according to claim 7, further comprising:
a deflector configured to perform blanking deflection of the charged particle beam having passed through the electron lens.

9. The apparatus according to claim 8, wherein a crossover of the charged particle beam having passed through the electron lens is formed at a central height position of the deflector.

10. A charged particle beam writing method comprising:
setting an n-th condition (n being an integer greater than or equal to 1) depending on at least one of a height position of an emission source for emitting a charged particle beam and an emission current value;

adjusting, based on that the n-th condition has been set, a height position of a shaping aperture member, arranged at a downstream side of the emission source with respect to an optical axis direction and having a first opening penetrating from an upper surface to a lower surface, to an n-th height position;

receiving irradiation of the charged particle beam on the shaping aperture member, based on the n-th condition, in a state where a limiting aperture member has been adjusted to the n-th height position, and shaping the charged particle beam by letting a part of the charged particle beam pass through a second opening of the shaping aperture member;

performing an n-th writing processing by using at least a part of the charged particle beam having been shaped based on the n-th condition;

resetting the n-th condition to an (n+m)th condition (m being an integer greater than or equal to 1), being different from the n-th condition, depending on at least one of the height position of the emission source and an emission current value;

readjusting, based on that resetting has been performed to set to the (n+m)th condition, the height position of the shaping aperture member from the n-th height position having been adjusted to an (n+m)th height position;

receiving irradiation of the charged particle beam on the shaping aperture member, based on the (n+m)th condition, in a state where the limiting aperture member has been readjusted to the (n+m)th height position, and shaping the charged particle beam by letting a part of the charged particle beam pass through the second opening of the shaping aperture member; and performing an (n+m)th writing processing by using at least a part of the charged particle beam having been shaped based on the (n+m)th condition.

* * * * *